(12) United States Patent
Zitlaw

(10) Patent No.: US 10,141,034 B1
(45) Date of Patent: Nov. 27, 2018

(54) MEMORY APPARATUS WITH NON-VOLATILE TWO-TERMINAL MEMORY AND EXPANDED, HIGH-SPEED BUS

(71) Applicant: Crossbar, Inc., Santa Clara, CA (US)

(72) Inventor: Cliff Zitlaw, San Jose, CA (US)

(73) Assignee: CROSSBAR, INC., Santa Clara, CA (US)

( * ) Notice: Subject to any disclaimer, the term of this patent is extended or adjusted under 35 U.S.C. 154(b) by 413 days.

(21) Appl. No.: 14/750,740

(22) Filed: Jun. 25, 2015

(51) Int. Cl.
| | |
|---|---|
| G06F 13/28 | (2006.01) |
| G11C 7/10 | (2006.01) |
| G11C 13/00 | (2006.01) |
| G11C 8/10 | (2006.01) |
| G06F 9/30 | (2018.01) |
| G06F 11/07 | (2006.01) |
| G06F 13/12 | (2006.01) |
| G06F 3/06 | (2006.01) |

(52) U.S. Cl.
CPC ........ *G11C 7/1048* (2013.01); *G06F 9/30043* (2013.01); *G06F 9/30145* (2013.01); *G06F 11/073* (2013.01); *G06F 11/0784* (2013.01); *G11C 8/10* (2013.01); *G11C 13/004* (2013.01); *G11C 13/0023* (2013.01); *G11C 13/0069* (2013.01); *G06F 3/0656* (2013.01); *G06F 13/128* (2013.01); *G06F 13/28* (2013.01)

(58) Field of Classification Search
None
See application file for complete search history.

(56) References Cited

U.S. PATENT DOCUMENTS

| | | | |
|---|---|---|---|
| 5,692,138 A | 11/1997 | Fandrich | |
| 5,909,703 A * | 6/1999 | Hansen | ............... G06F 12/0623 711/106 |
| 5,926,642 A | 7/1999 | Favor | |

(Continued)

OTHER PUBLICATIONS

Mobile LPDDR3 SDRAM, Invention disclosure conference, 2014, 160 Pages, Micron Technology, Inc., Boise, Idaho.
(Continued)

*Primary Examiner* — Henry Tsai
*Assistant Examiner* — Aurangzeb Hassan
(74) *Attorney, Agent, or Firm* — Amin, Turocy & Watson, LLP

(57) ABSTRACT

Providing for an electronic memory apparatus having high-density, non-volatile memory arrays in conjunction with a high-speed communication interface is disclosed herein. In some embodiments, the electronic memory apparatus can include multiple banks of two-terminal memory, communicatively connected to a modified dynamic random access memory bus and configured to operate according to a modified communication protocol. In one or more embodiments, the high-speed communication interface can comprise more than ten command and address pins to identify individual memory banks (or subsets of memory banks) of the multiple banks of memory, to facilitate bank-specific addressing for memory array operations. In some embodiments, the electronic memory can facilitate status information for subsets of memory banks to facilitate informed array operations, increasing duty cycle of the memory device.

27 Claims, 12 Drawing Sheets

(56) References Cited

U.S. PATENT DOCUMENTS

| | | | |
|---|---|---|---|
| 6,016,537 A * | 1/2000 | Hansen | G06F 12/06 |
| | | | 711/211 |
| 6,061,749 A * | 5/2000 | Webb | G06F 9/3879 |
| | | | 345/603 |
| 6,081,783 A * | 6/2000 | Divine | H03M 7/30 |
| | | | 704/201 |
| 6,195,674 B1 * | 2/2001 | Elbourne | G06F 9/3879 |
| | | | 708/401 |
| 6,260,101 B1 * | 7/2001 | Hansen | G06F 12/0623 |
| | | | 710/22 |
| 8,117,351 B1 | 2/2012 | Mangalindan | |
| 2002/0007451 A1 | 1/2002 | Cho et al. | |
| 2002/0053015 A1 | 5/2002 | Tan et al. | |
| 2004/0003209 A1 | 1/2004 | Mitsuishi et al. | |
| 2005/0015539 A1 * | 1/2005 | Horii | G06F 13/1647 |
| | | | 711/103 |
| 2005/0172089 A1 | 8/2005 | Klingman | |
| 2007/0118713 A1 | 5/2007 | Guterman | |
| 2008/0082750 A1 | 4/2008 | Okin et al. | |
| 2008/0082751 A1 | 4/2008 | Okin et al. | |
| 2008/0082766 A1 | 4/2008 | Okin et al. | |
| 2008/0126682 A1 | 5/2008 | Zhao et al. | |
| 2008/0126712 A1 | 5/2008 | Mizushima | |
| 2008/0162790 A1 | 7/2008 | Im | |
| 2008/0229034 A1 | 9/2008 | Cauchy et al. | |
| 2009/0138626 A1 | 5/2009 | Le et al. | |
| 2010/0274960 A1 | 10/2010 | Lee et al. | |
| 2010/0332718 A1 | 12/2010 | Farrell et al. | |
| 2011/0185109 A1 | 7/2011 | Karabatsos | |
| 2012/0173851 A1 | 7/2012 | Lewis | |
| 2012/0236650 A1 * | 9/2012 | Nazarian | G11C 13/0007 |
| | | | 365/185.18 |
| 2013/0138882 A1 | 5/2013 | Shaeffer et al. | |
| 2013/0227229 A1 | 8/2013 | Ishikawa | |
| 2013/0297864 A1 | 11/2013 | Gupta | |
| 2013/0339829 A1 | 12/2013 | Vargas et al. | |
| 2014/0162470 A1 * | 6/2014 | Fricker | H01R 12/523 |
| | | | 439/65 |
| 2014/0269139 A1 | 9/2014 | Wang | |
| 2014/0284535 A1 | 9/2014 | Saitoh et al. | |
| 2014/0372670 A1 | 12/2014 | Vasilyuk | |
| 2015/0095565 A1 | 4/2015 | Morris et al. | |
| 2015/0169224 A1 | 6/2015 | Alexander et al. | |
| 2016/0292092 A1 * | 10/2016 | Gavens | G06F 3/0604 |
| 2017/0003880 A1 | 1/2017 | Fisher et al. | |

OTHER PUBLICATIONS

NAND Flash Memory, Invention disclosure conference, 2010, 167 Pages, Micron Technology, Inc., Boise, Idaho.

Office Action for U.S. Appl. No. 14/749,947 dated May 5, 2017, 51 pages.

Office Action for U.S. Appl. No. 14/750,293 dated Jul. 17, 2017, 24 pages.

Office Action for U.S. Appl. No. 14/749,947 dated Jul. 13, 2018, 67 pages.

\* cited by examiner

FIG. 6

MODE REGISTER COMMUNICATION PROTOCOL 600

COMMAND ADDRESSES 608

| | CA 00 | CA 01 | CA 02 | CA 03 | CA 04 | CA 05 | CA 06 | CA 07 | CA 08 | CA 09 | CA 10 | CA 11 | CA 12 | CA 13 | CA 14 | CLK EDGE |
|---|---|---|---|---|---|---|---|---|---|---|---|---|---|---|---|---|
| MODE REGISTER WRITE 604 | L | L | L | L | MA 0 | MA 1 | MA 2 | MA 3 | MA 4 | MA 5 | BA 0 | BA 1 | BA 2 | BA 3 | BA 4 | ← |
| | MA 6 | MA 7 | OP 0 | OP 1 | OP 2 | OP 3 | OP 4 | OP 5 | OP 6 | OP 7 | BA 5 | BA 6 | BA 7 | BA 8 | BA 9 | → |
| MODE REGISTER READ 606 | L | L | L | H | MA 0 | MA 1 | MA 2 | MA 3 | MA 4 | MA 5 | BA 0 | BA 1 | BA 2 | BA 3 | BA 4 | ← |
| | MA 6 | MA 7 | X | X | X | X | X | X | X | X | BA 5 | BA 6 | BA 7 | BA 8 | BA 9 | → |

MEMORY APPARATUS WITH NON-VOLATILE TWO-TERMINAL MEMORY AND EXPANDED, HIGH-SPEED BUS

INCORPORATION BY REFERENCE

Co-pending U.S. patent application Ser. No. 14/749,947, filed Jun. 25, 2015 and entitled MULTIPLE-BANK MEMORY DEVICE WITH STATUS FEEDBACK FOR SUBSETS OF MEMORY BANKS and U.S. patent application Ser. No. 14/750,293, now U.S. Pat. No. 9,921,763, issued Mar. 20, 2018 and entitled MULTI-BANK NON-VOLATILE MEMORY APPARATUS WITH HIGH-SPEED BUS, are each hereby incorporated by reference herein in their entireties and for all purposes.

TECHNICAL FIELD

This disclosure relates generally to electronic memory; as one example, the disclosure describes an electronic memory comprising multiple banks of non-volatile memory with a high-speed interface and expanded command and address bus.

BACKGROUND

A recent innovation within the field of integrated circuit technology is two-terminal memory technology. Two-terminal memory technology is contrasted, for instance, with gate-controlled transistors in which conductivity between two terminals is mediated by a third terminal, called a gate terminal. Two-terminal memory devices can differ from three terminal devices in function as well as structure. For instance, some two-terminal devices can be constructed between a pair of conductive contacts, as opposed to having a third terminal that is adjacent to a set of conductive terminals. Rather than being operable through a stimulus applied to the third terminal, two-terminal memory devices can be controlled by applying a stimulus at one or both of the pair of conductive contacts. The inventor(s) of the present disclosure is further aware of a variety of two-terminal memory technologies, such as phase-change memory, magneto-resistive memory, conductive-bridging memory, as well as others.

One two-terminal memory worth noting is resistive memory. While much of resistive memory technology is in the development stage, various technological concepts for resistive memory have been demonstrated by the assignee of the present invention and are in one or more stages of verification to prove or disprove associated theory(ies). Even so, resistive memory technology promises to hold substantial advantages over competing technologies in the semiconductor electronics industry.

As models of resistive memory technology are tested and results obtained, the results are speculatively extrapolated to memory devices in which resistive memory replaces a conventional memory. For instance, the assignee of the present invention has conducted research related to software models of memory arrays comprising resistive memory instead of complementary metal-oxide semiconductor (CMOS) NAND or NOR memory. Software projections suggest that two-terminal memory arrays can provide significant benefits for electronic devices, including reduced power consumption, higher memory density, advanced technology nodes, or improved performance, among others.

In light of the above, the inventor endeavors to discover applications where two-terminal memory can provide real-world benefits for electronic devices.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Various aspects of the present disclosure provide for an electronic memory apparatus having high-density, non-volatile memory in conjunction with a high-speed communication interface. In some embodiments, the electronic memory apparatus can include multiple banks of resistive-switching memory, communicatively connected to a modified dynamic random access memory bus, such as a modified low power double data rate type 3 (LPDDR3) bus, a modified LPDDR4 bus, and so forth. In one or more embodiments, the high-speed communication interface can comprise a command and address bus carrying greater than 20 bits of data, to facilitate bank-specific addressing for memory operations. In at least one embodiment, the high-speed communication interface can comprise a command and address bus carrying 30 bits of data.

In further disclosed embodiments, a multi-bank memory array is provided for an electronic memory apparatus. The memory array can comprise a set of status registers configured to collect and output status information for respective subsets of multiple memory banks of the multi-bank memory. Status information can be accessed on-demand via one or more mode registers programmed for status-related operations, allowing a host to issue memory operations with real-time or near real-time status information for subsets of memory banks. In a further embodiment, global status information can be output on a global status bus, and in some embodiments, interrupting the host as to identified errors, idle state, ECC correction, and so forth.

According to one or more embodiments, the present disclosure provides an electronic memory. The electronic memory can comprise a memory cell array comprising multiple banks of non-volatile, two-terminal memory and a set of mode registers to facilitate programming the electronic memory according to a programmed operation setting of a set of defined operation settings. Moreover, the electronic memory can comprise logic circuitry configured to implement operations on a subset of the multiple banks of the memory cell array according to the programmed operation setting and in response to a memory command. In addition, the electronic memory can comprise a bus interface that comprises a command and address input comprising greater than ten signal pins for receipt of the memory command and a physical memory address for the command, and comprises a bidirectional data bus for receiving new data to write to the physical memory address in response to the memory operation being a memory write, or for receiving stored data from the physical memory address and outputting the stored data in response to the memory operation being a memory read, the bidirectional data bus comprising greater than eight signal pins. Further to the above, the electronic memory can comprise a command and address decoder configured to receive greater than twenty bits of command and address information from the memory command, identify from the greater than twenty bits of command and address information a memory operation specified by the memory command, a target bank of the multiple banks of non-volatile, two-terminal memory and the physical memory address within the target bank.

In further embodiments, there is described a method of operating a memory device. The method can comprise issuing a first array instruction to a first memory bank of the memory device and issuing a second array instruction to a second memory bank of the memory device to be implemented at least in part concurrent with the first array instruction. Furthermore, the method can comprise requesting status information exclusive to a subset of memory banks of the memory device, the subset including the first memory bank and excluding the second memory bank and receiving status data in response to the requesting the status information, the status data is indicative of a busy state for the subset of memory banks or an idle state for the subset of memory banks. In addition to the foregoing, the method can comprise at least one of: issuing a third array instruction to the first memory bank in response to the status data being indicative of the idle state or issuing the third array instruction to a third memory bank of the memory device, in response to the status data being indicative of the busy state.

In one or more additional embodiments, the subject disclosure provides a method of implementing a memory operation received from a host device. The method can comprise receiving an instruction for a memory array operation on a set of command and address pins of a memory interface, the instruction configured according to a command and address memory protocol and including identifier information that distinctly identifies a target bank of a multi-bank memory array among a set of sixteen or more memory banks of the multi-bank memory array, and an address location within the target bank. Furthermore, the method can comprise decoding the instruction according to the command and address memory protocol and identifying the target bank and the address location from the identifier information. Moreover, the method can comprise implementing the memory array operation for the address location within the target bank of the multi-bank memory array, and outputting a result of the memory array operation.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure;

FIG. 6 illustrates a diagram of an example communication protocol for mode register operations, in further embodiments;

DETAILED DESCRIPTION

Figure 1:
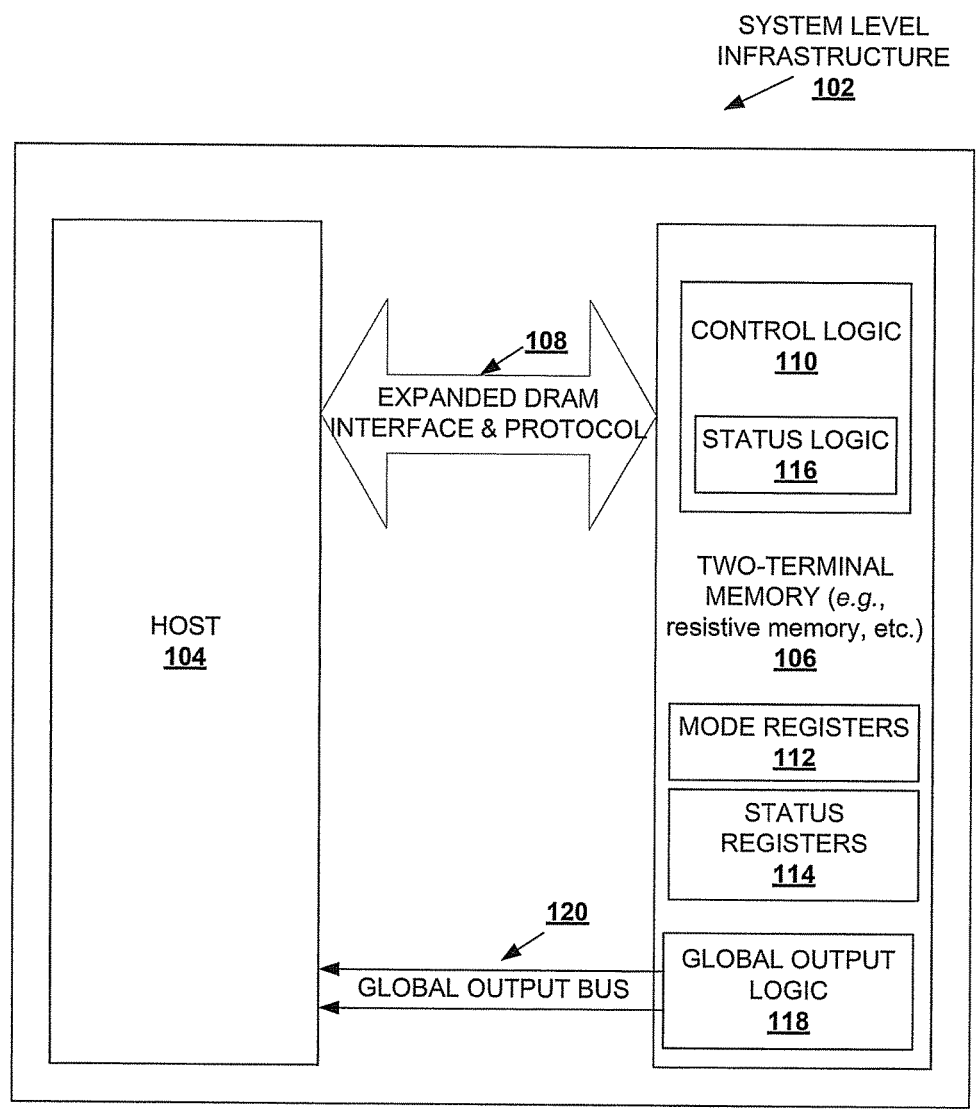
FIG. 1 depicts a block diagram of an example non-volatile memory having a high speed interface with expanded bus, in an embodiment(s)

The present disclosure relates to electronic devices comprising multiple banks of memory, which can be accessed or controlled by a host device to perform memory operations. The host device can access or control the memory banks as a group, or can control respective subsets of the memory banks independently. For example, one or two memory banks (or any other suitable subset) can be assigned a first memory operation, whereas other memory banks can be assigned a second memory operation that can be performed at least in part concurrent with the first memory operation. This can be accomplished, for instance, where the first memory operation and second memory operation target different subsets of memory (e.g., different memory banks, different subsets of different memory banks, and so on), and the subsets of memory have sufficient circuitry to operate independently. In theory, a larger number of memory banks facilitates greater capacity for interleaved operation (e.g., parallel or concurrent operation among multiple memory banks), subject to the circuitry involved in carrying out these operations on subsets of the memory. In some embodiments, the multiple memory bank arrangement facilitates significant interleaved operation, for instance with an electronic device provided with sufficient per-bank circuitry to enable respective memory banks to operate at least in part independently from other memory banks.

In one or more embodiments, a non-volatile memory device is provided having high read and write performance, as well as much higher throughput than conventional non-volatile memory. The non-volatile memory device can be a removable memory device (e.g., a thumb drive, a secure digital (SD) card, etc.), internal or external hard drive (e.g., solid-state hard drive, and so forth), embedded memory, or the like. In various embodiments, the non-volatile memory device can comprise a 16-bit (or larger) data bus and multiple banks of two-terminal memory chips with significant capacity for interleaved operation. In further embodiments, the non-volatile memory device can have a command and address bus that is larger than 10-bits to address respective subsets of the multiple banks of memory independently, facilitating the parallel operation. The inventor(s) estimate throughput values as high as 3.2 gigabytes (GB) per second for 800 megahertz (Mhz) data bus clock (or larger, for faster clock speeds), can be achieved in at least some disclosed embodiments. These are significantly faster throughputs than conventional non-volatile memory devices allow, and also incorporate the high write and erase speeds, data retention, and longevity of two-terminal memory.

In further disclosed embodiments, a multi-bank memory device is provided that can be configured to generate or output status information pertaining to subsets of the multiple memory banks. Status information can be acquired in response to a host query identifying a subset of memory banks, in some embodiments. In other embodiments, the multi-bank memory device can provide status information for one or more subsets of memory banks as part of a reply to an array command(s) targeting the subsets of memory banks (e.g., a set of memory operations distributed among the multiple memory banks). In still other embodiments, the multi-bank memory device can provide a global output in addition to subset-specific status information. In various embodiments, status information can include busy/idle information, operation pass/fail information, error correction code (ECC) pass/fail information, or the like, or a suitable combination thereof. In further embodiments, a set of status information can be generated and provided for as few as one memory bank, as many as all memory banks, or any suitable number there between. For instance, in various embodiments, bank-specific status information can be generated by disclosed memory devices for each respective memory bank. The bank-specific status information can be output in response to a query, upon completion of a mode register operation, upon completion of a memory array operation(s), and so forth. However, the subject disclosure is not so limited, and status information can be generated or reported for a plurality of memory banks (e.g., two memory banks, three memory banks), or can be generated and reported for non-homogenous numbers of memory banks (e.g., one report can include status information for one memory bank, and a second report can include status information for two memory banks, and so on).

By providing status information for subsets of multiple memory banks, a host device can increase a duty cycle of multi-bank memory, achieving higher memory efficiencies and potentially higher throughput. As an example, consider a memory device configured to output only global status information. Such a device is limited to specifying that all banks are busy or all banks are idle, no bank has an error or some unknown number of banks have an error, and so forth. Without knowing which memory banks are busy, a host device may be required to wait for all memory banks to complete existing operations before initiating a new operation. This could lead to significant downtime as some memory banks, having completed queued memory operations, are idle while other memory banks continue with queued operations. Likewise, sophisticated error correction techniques that apply corrections directly to affected areas of memory may be more difficult to deploy. On the other hand, the various embodiments disclosed herein provide greater granularity of feedback information. This enables a host to issue new commands to subsets of memory banks as they become idle, more efficiently target error correction routines to affected areas of memory, and facilitate much more efficient utilization of multi-bank memory resources in general.

In addition to the foregoing, some embodiments disclose a memory device having global memory bank status capabilities, combined with more granular status information affecting a subset of memory banks. Global memory bank status information can be output by the memory device as an interrupt, notifying a host of status information. The host can then respond to the interrupt and obtain status information specific to one or more subsets of memory banks to inform subsequent processes, making those processes more efficient.

In still other embodiments, the subject disclosure provides for disparate memory bank configurations for different subsets of memory banks in a multi-bank memory device. These embodiments enable configuration programming for a first subset of memory banks that can be different from configuration programming of a second subset of memory bank. As one example, a first subset of memory banks can be configured for multi-level cell (MLC) operation (e.g., having the capacity to store more than one bit of information), whereas a second subset of the memory banks can be configured for single level cell (SLC) operation (e.g., storing a single bit of information). As another example, the first subset of memory banks can be configured to operate according to a first clock speed, a first latency, or other physical characteristic, whereas a second subset of memory banks can be configured to operate according to a second clock speed, a second latency, and so on. In some embodiments, one or more mode registers can be established for configuration programming of subsets of memory banks. A mode register operation targeting these one or more mode registers can be utilized to implement subset-specific memory bank configuration programming, or reading current subset-specific configuration programming.

Referring now to the drawings, FIG. 1 illustrates a block diagram of an example electronic device 100 according to disclosed embodiments. A system level infrastructure 102 representation of electronic device 100 can comprise a host 104 communicatively connected to a two-terminal memory 106 via an expanded dynamic random access memory (DRAM) interface 108 and an associated expanded DRAM communication protocol. Note that in some embodiments, system level infrastructure 102 can comprise a mechanical housing for physical placement of host 104, two-terminal memory 106 and expanded DRAM interface 108, as well as other components that are not depicted (e.g., one or more clock sources, support circuitry, internal or external communication components, and so forth), whereas in other embodiments components of system level infrastructure 102 can be located in separate mechanical housings (e.g., host 104 can be a computer, and two-terminal memory 106 can be a memory device removably connected to host 104), be located remotely from one another and communicate in part over a network, or the like. In some embodiments, host 104 can be a special purpose memory controller (e.g., configured to operate two-terminal memory 106) with an external interface (e.g., a universal serial bus, a parallel ATA bus, a serial ATA bus, a wireless interface such as Wi-Fi, Bluetooth, Zigbee, etc., and so on), to a general computing device (e.g., a computer, a smartphone, a tablet computer, an electronic computing device, an operating system, and so on), whereas in other embodiments host 104 can be a general computing device.

Two-terminal memory 106 comprises a plurality of memory banks. Each of the plurality of memory banks can be addressed and operated individually, and comprise suitable circuitry and interconnects to receive, execute and respond to memory operations independently of other memory banks. In some embodiments, respective memory banks are connected to a data bus of expanded DRAM interface 108, and can receive data from the data bus or output data to the data bus independently of other memory banks.

Expanded DRAM interface 108 can be a modified low power double data rate type 3 (LPDDR3) or a modified LPDDR4 interface, in various embodiments. The subject disclosure is not so limited, however, as other standard or non-standard high-speed bus architectures can be employed. In some embodiments, expanded DRAM interface 108 can comprise a 16-bit (or larger) bidirectional data bus (although other embodiments can comprise different-sized data busses, such as 24-bit, 32-bit, etc., by stacking multiple 8-bit dies physically in parallel to form the data bus). In additional embodiments, expanded DRAM interface 108 can comprise a command and address bus having more than 10 pins, and thus convey more than 20 bits of data. In at least one embodiment, the command and address bus can have 15 pins, and convey 30 bits of data (e.g., 15 bits on a rising clock edge; 15 bits on a falling clock edge). Furthermore, expanded DRAM interface 108 can be configured according to a modified DRAM communication protocol suitable to address, read from and write to, respective subsets of the multiple memory banks of two-terminal memory 106, as well as to address, read from and write to mode registers 112 and status registers 114 of two-terminal memory 106.

According to various embodiments, two-terminal memory 106 can comprise control logic 110 configured to respond to commands issued by host 104 over expanded DRAM interface 108 and execute the commands on two-terminal memory 106. Control logic 110 can comprise a decoder configured according to a modified DRAM communication protocol employed by expanded DRAM interface 108, suitable to receive, read, execute or respond to the commands issued by host 104. Additionally, control logic 110 can comprise status logic 116 configured to identify and decode status-related commands (e.g., commands addressed to one or more of status registers 114) issued by host 104, and implement those commands on status registers 114. Status-related commands can include programming or configuring one or more of status registers 114, or acquiring and outputting status information from subsets of memory banks.

Two-terminal memory 106 can additionally comprise global output logic 118. Global output logic 118 can be configured to aggregate and output status information pertaining to the memory banks of two-terminal memory 106. In some embodiments, global output logic 118 can comprise one or more OR logic circuits connected to respective status output pins of status registers 114. For instance, an OR logic circuit can aggregate busy/idle status output of status registers 114, to determine whether any of the memory banks of two-terminal memory 106 are in a busy state, or in some embodiments whether any memory banks are in the idle state. As another example, an OR logic circuit can aggregate pass/fail status output of status registers 114, to determine whether any memory banks have failed a memory operation, or aggregate ECC status to determine whether any memory banks have failed an ECC correction, and so on. Global status information aggregated by global output logic 118 can be provided to host 104 on a global output bus 120. In some embodiments, global output bus 120 can output global status information in response to a query issued by host 104, whereas in other embodiments global output bus 120 can interrupt host 104 with global status information.

In various embodiments, two-terminal memory 106 can comprise any suitable two-terminal memory technology. Examples include resistive-switching memory (e.g., resistive random access memory—or RRAM), phase-change memory, conductive-bridging memory, magneto-resistive memory, ferromagnetic memory, organic memory, or the like. In at least some embodiments, two-terminal memory 106 can comprise different two-terminal memory technologies for different subsets of memory banks.

A memory technology employed for two-terminal memory 106 can include a filamentary-based memory cell. One example of a filamentary-based memory cell can comprise: a conductive layer (e.g. TiN, TaN, TiW) or a conductive silicon (Si) bearing layer (e.g., doped polysilicon, polycrystalline SiGe, etc.) a resistive switching layer (RSL) having crystalline defects or defect regions (e.g. amorphous silicon, intrinsic silicon, non-stoichiometric oxide, non-stoichiometric silicon oxide); and an active metal layer for providing filament forming particles to the defect regions of RSL. In various examples, the active metal layer can include, among others: silver (Ag), copper (Cu), gold (Au), titanium (Ti), nickel (Ni), aluminum (Al), chromium (Cr), tantalum (Ta), iron (Fe), manganese (Mn), tungsten (W), vanadium (V), cobalt (Co), platinum (Pt), and palladium (Pd), alloys of such metals, as well as materials rich in such metals, such as non-stoichiometric metal compounds. Other suitable conductive materials, as well as compounds or combinations of the foregoing can be employed for the active metal layer in some aspects of the subject disclosure. In various embodiments, particles of metal derived from the active metal layer become trapped within the defect regions (e.g. voids, grain boundaries, or the like) of the RSL. These trapped particles can be neutral metal particles (e.g., in the absence of an ionizing stimulus) that form conductive filaments within the RSL. Some details pertaining to embodiments of the subject disclosure similar to the foregoing example can be found in the following U.S. patent applications that are licensed to the assignee of the present application for patent: application Ser. No. 11/875,541 filed Oct. 19, 2007 and application Ser. No. 12/575,921 filed Oct. 8, 2009, each of which are incorporated by reference herein in their respective entireties and for all purposes.

In some aspects, the two-terminal memory 106 can comprise 65 nanometer (nm) technology, whereas in other aspects the two-terminal memory can comprise sub-65 nanometer technology (e.g., 45 nm, 32 nm, 22 nm, 14 nm, 10 nm, 7 nm, 5 nm, and others). Moreover, the two-terminal memory can have a component area that is less than about 5 $F^2$ (e.g., about 4.28 $F^2$). In some aspects, three-dimensional stacks of two-terminal memory arrays can be provided, reducing component area. For instance, a 4.28 $F^2$ device can have an effective component area of 2.14 $F^2$ for a three-dimensional device having two stacked layers. As another example, the 4.28 $F^2$ device can have an effective component area of 1.07 $F^2$ for a three-dimensional device having four stacked layers, and so on. In the case of multi-level cells (MLC), two stacked layers of cells that can represent two bits of data per cell can have an effective component area of 1.07 $F^2$, and better component area metrics can be achieved by either increasing the number of stacks or the number of bits represented by the cells.

Figure 2:
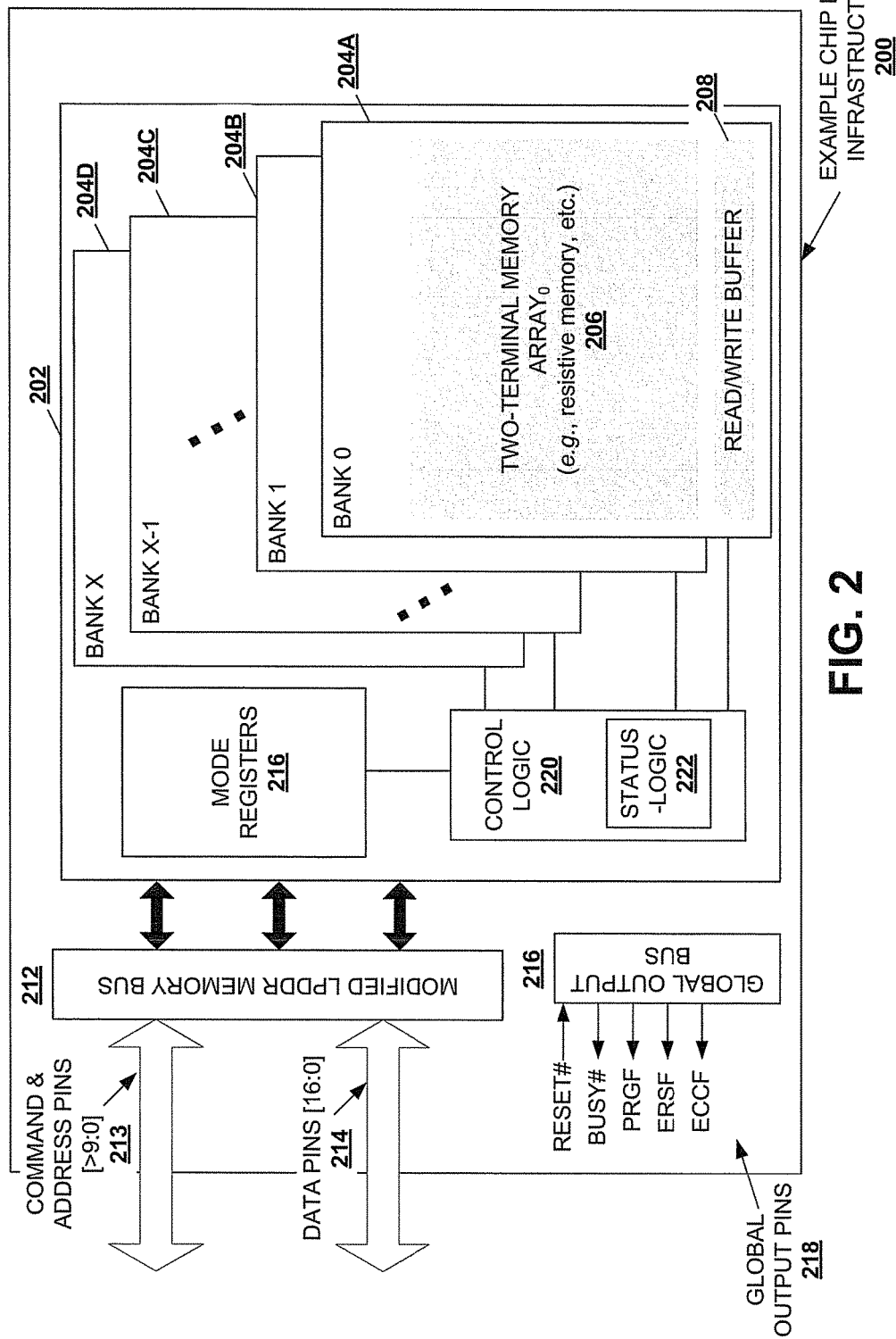
FIG. 2 illustrates a block diagram of a sample multi-bank memory apparatus with a modified LPDDR bus, in one or more embodiments.

FIG. 2 illustrates a block diagram of an example chip level infrastructure 200 for an electronic device according to alternative or additional embodiments of the present disclosure. Chip level infrastructure 200 can comprise a memory 202 having multiple banks of memory, including memory bank$_0$ 204A, memory bank$_1$ 204B, . . . , memory bank$_{X-1}$ 204C and memory bank$_X$ 204D (referred to herein collectively as memory banks 204A-204D), where X is a suitable positive integer greater than 3. Memory banks 204A-204D can respectively comprise an array of two-terminal memory cells 206 (e.g., a filamentary memory device, resistive-switching memory, RRAM, and so on), a read/write buffer 208 for queuing received commands, as well as data to be written to memory array 206 or data to be read out from memory array 206, in some embodiments.

Further to the above, chip level infrastructure 200 can comprise a modified LPDDR bus 212 (e.g., a modified LPDDR3 bus, a modified LPDDR4 bus, etc.) facilitating communication between memory 202 and a host (not depicted, but see host 104 of FIG. 1, supra). In one embodiment, modified LPDDR bus 212 can be a modified LPDDR3 interface. In another embodiment, modified LPDDR bus 212 can be a modified LPDDR4 interface (e.g., comprising more, or fewer, command and address pins, as one example). In some embodiments, however, modified LPDDR bus 212 can be replaced with another standard or modified standard bus, or a non-standard interface. In various embodiments, modified LPDDR bus 212 can comprise a set of command and address pins 213 for a command and address bus, and a set of data pins 214 for a bidirectional data bus. The command and address bus can facilitate receiving commands for memory 202, including array read/write commands for two-terminal memory arrays 206, and mode register read/write commands for a set of mode registers 216. The mode register read/write commands can also include commands for reading/programming configuration registers of mode registers 216 (not depicted—but see FIG. 5, infra), or reading/programming status registers of mode registers 216 (not depicted—but see FIGS. 3 and 4, infra). The command and address bus can facilitate other suitable functions related to controlling operations of memory 202 not specifically described. In some embodiments, command and address pins 213 can comprise 15 pins, providing 30 bits for the command and address bus. As depicted, data pins 214 can include 16 pins, yielding a 16-bit data bus, in some embodiments, whereas other embodiments can comprise a larger data bus.

Figure 7:
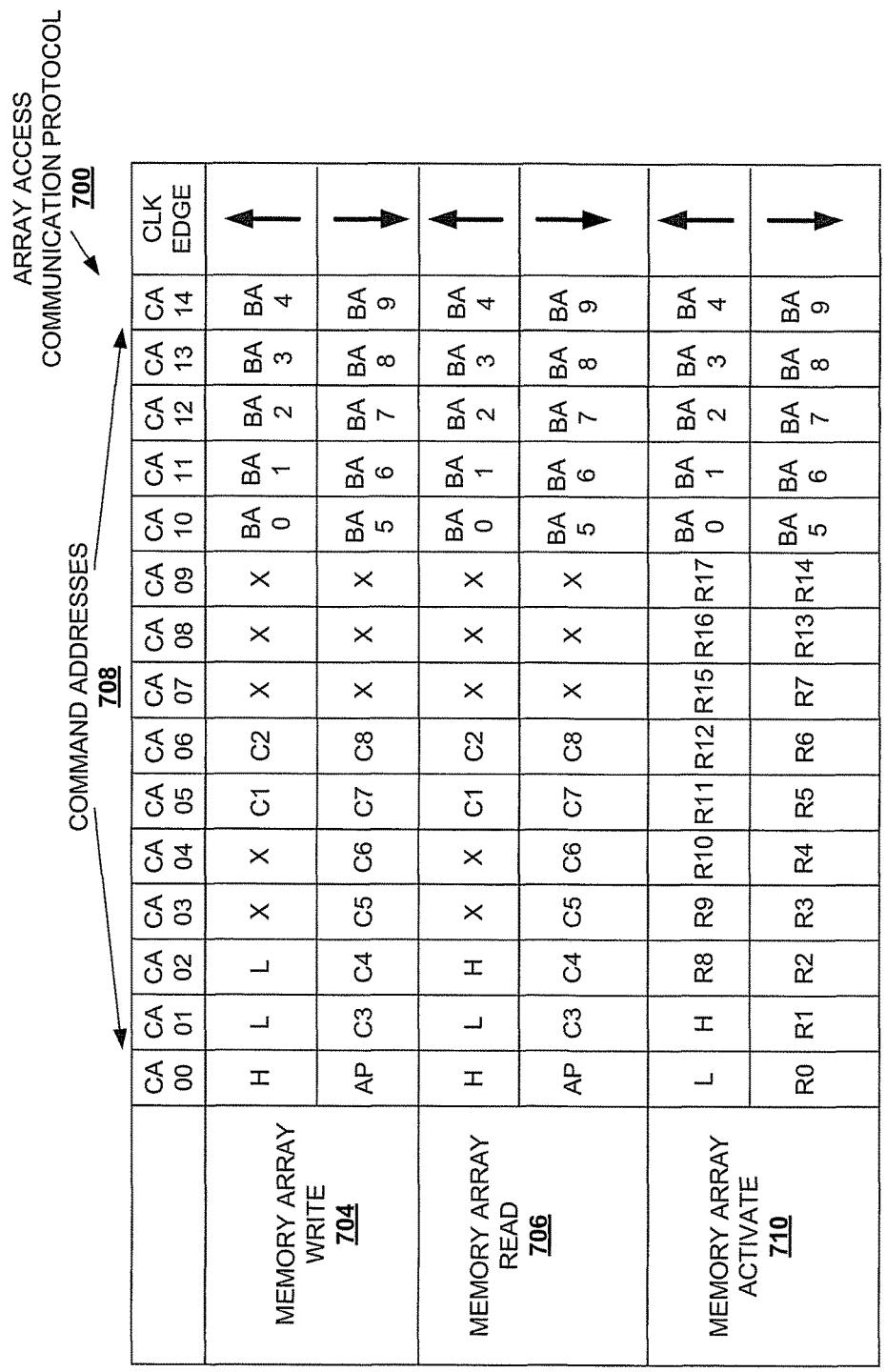
FIG. 7 depicts a diagram of a sample communication protocol for memory array operations, in additional embodiments.

In further embodiments, a communication protocol associated with modified LPDDR bus 212 can govern definitions, operations, and rules associated with information transmitted over modified LPDDR bus 212, including relationship between such information, definitions, operations and rules relative to respective input/output pins of bus/interface 212 (e.g., see FIGS. 6 and 7, infra). In one or more embodiments, the communication protocol can provide an addressing mechanism to differentiate respective subsets of memory banks 204A-204D (e.g., individual memory banks, pairs of memory banks, or other suitable subset) from other subsets thereof. In at least one embodiment, modified LPDDR bus 212 can comprise an extended set of command and address pins (e.g., greater than 10 pins, or 15 pins, or other suitable number) that can be utilized, at least in part, as memory bank identifier bits to individually address a target subset of memory banks 204A-204D. In response to receiving an array operation, memory 202 can perform the array operation on the target subset of memory banks 204A-204D specified by the memory bank identifier bits.

In an embodiment(s), chip level infrastructure 200 can comprise a global status bus 216. Global output bus 216 can comprise a set of global output pins 218 related to outputting information related to all of memory banks 204A-204D. For instance, global output pins 218 can be physical input/output pins on global output bus 216, in an embodiment. Global output bus 216 can output a busy/idle status (BUSY#) for memory banks 204A-204D, which indicates the busy status when any of memory banks 204A-204D are performing a memory operation or have a memory operation queued in an associated read/write buffer 208. Additionally, global output buffer 216 can comprise a program fail output (PRGF), which can indicate a program failure of any program operation associated with memory banks 204A-204D fails to properly write data to an associated two-terminal memory array 206. Further, global output buffer 216 can comprise an erase fail output (ERSF), which can indicate an erase failure in response to any erase operation associated with memory banks 204A-204D failing to properly erase data from an associated memory array 206, and can comprise an ECC fail output (ECCF) that can indicate an error correction code in response to identifying a read error for any of memory banks 204A-204D in conjunction with reading data from an associated memory array 206. In further embodiments, global output bus 216 can comprise a reset input for resetting busy/idle, program fail, erase fail or ECC fail indicators.

In an alternative or additional embodiment, global status information can be provided by a global status-related one of mode registers 216 (not depicted—referred hereinafter as a global status mode register). The global status mode register can have a mode register address for differentiating the global status mode register from other mode registers 216. In response to receiving a command comprising the global status mode register address, control logic 220 can access global status logic 222. Global status logic 222 can provide definitions, operations and rules for accessing, reporting, resetting, etc. global status information for the memory banks 204A-204D, in response to suitable global status commands.

Figure 3:
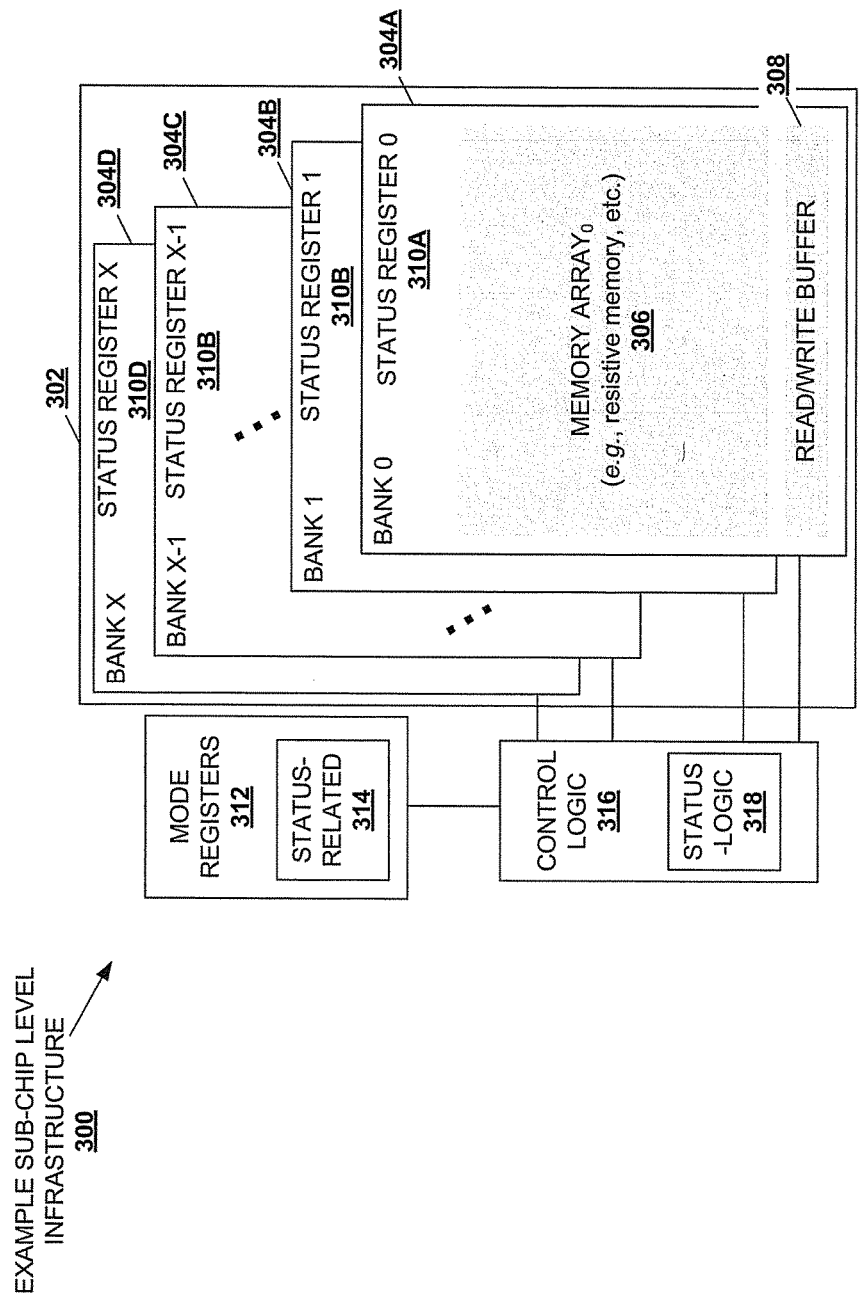
FIG. 3 depicts a block diagram of a sample multi-bank memory with bank-specific status registers and control logic, in other embodiments.

FIG. 3 depicts a block diagram of an example sub-chip level infrastructure 300 for an electronic memory device, according to further embodiments of the present disclosure. Sub-chip level infrastructure 300 can comprise a memory 302 having multiple banks of memory, including memory bank$_0$ 304A, memory bank$_1$ 304B, . . . , memory bank$_{X-1}$ 304C and memory bank$_X$ 304D (referred to herein collectively as memory banks 304A-304D), where X is a suitable positive integer greater than 3. Respective memory banks 304A-304D can respectively comprise an array of memory cells (memory array) 306, a read/write buffer 308 for queuing received commands, reading data from or writing data to memory array 306. Memory array 306 can comprise two-terminal memory as described herein. However, in at least one embodiment, memory array 306 can comprise volatile or non-volatile three-terminal memory in other embodiments (e.g., NAND, NOR, DRAM, etc.). Further to the above, respective memory banks 304A-304D can comprise an associated status register, including status register$_0$ 310A (of memory bank 304A), status register$_1$ 310B (of memory bank 304B), . . . , status register$_{X-1}$ 310C (of memory bank 304C) and status register$_X$ 310D (of memory bank 304D), collectively referred to as status registers 310A-310D.

Status registers 310A-310D can be configured to store status information pertaining to respective memory banks 304A-304D. Status information can include, for instance, program pass/fail status of an associated one of memory banks 304A-304D, read pass/fail status of an associated one of memory banks 304A-304D, busy/idle status of an associated one of memory banks 304A-304D, ECC error status of an associated one of memory banks 304A-304D, or the like, or a suitable combination of the foregoing. For instance, in response to a program failure for memory bank 304A, status register 310A can store a program failure indication (e.g., set a program fail bit high, setting the program fail bit low, etc.) for memory bank 304A. A host can retrieve this information through status commands (see below) directed at one or more of status registers 310A-310D. In some embodiments, a global status output can also indicate status information for memory 302 (e.g., see FIG. 2, supra). The global status output can be employed by the host to query status registers 310A-310D to discover bank-specific status information (e.g., in response to receiving the global status output, though other conditions can initiate acquisition of bank-specific status information, such as programming, periodic queries, and so forth). Thus, as one example, in response to obtaining a global output related to program pass/fail, read pass/fail, memory bank idle state, or ECC failure, the host can be configured to obtain bank-specific information (or information specific to a subset of memory banks 304A-304D) related to program failure, read failure, idle state or ECC failure, etc.

Status registers 310A-310D can be individually addressed according to a communication protocol associated with memory 302. In some embodiments, status registers 310A-310D can respectively have unique status addresses, or respective subsets of status registers 310A-310D can have a unique status address. A status-related command can specify an address of a target status register(s) 310A-310D, and include command values—associated with a selected status operation—to be written to the target status register(s) 310A-310D. In response to the command values, the target status register(s) 310A-310D can be configured to carry out the selected status operation mapped to the command values on an associated one (or more) of memory banks 310A-310D. Suitable status operations can include obtaining status information related to the associated memory bank(s) 310A-310D, initiating a monitoring routine to track status of the associated memory bank(s) 310A-310D, outputting current status information, or the like.

In other embodiments, the status registers 310A-310D can share an address of an associated one of memory banks 304A-304D. In these latter embodiments, a command addressed to one or more status-related mode register(s) 314 of a set of mode registers 312 of memory 302 can be interpreted by status logic 318 of control logic 316 as a status operation. The command can include command values mapped to one or more status-related operations, written to the status-related mode register(s) 314, as well as an identifier(s) for one or more target memory bank(s). Status logic 318 can read the command values written to the status-related mode register(s) 314, determine a status operation mapped to the command values, and carry out the status operation on the target memory bank(s). Stated more generally, status commands can be defined as a subset of command and address bus commands that are written to one or more status-related registers 314 of mode registers 312. This subset of commands can thereby be differentiated from array commands, or other configuration commands, and the command values mapped to status-related operations rather than configuration operations, array operations, and so forth.

As an illustrative example, in response to receiving a command written to status-related mode register(s) 314, control logic 316 can trigger application of status logic 318. Status logic 318 can store definitions, operations and rules associated with addressing the status registers 310A-310D, decoding status register addresses from command and address protocol information (e.g., depending on whether status registers 310A-310D have a unique address space, or share addresses of associated memory banks 304A-304D), mapping command value information (e.g., command codes) to a set of status operations performed in relation to status registers 310A-310D, decoding the command value information, and carrying out an appropriate status operation(s) on a target status register(s) 310A-310D in response to decoding the status operation(s) from the command value information provided by the command.

Figure 4:
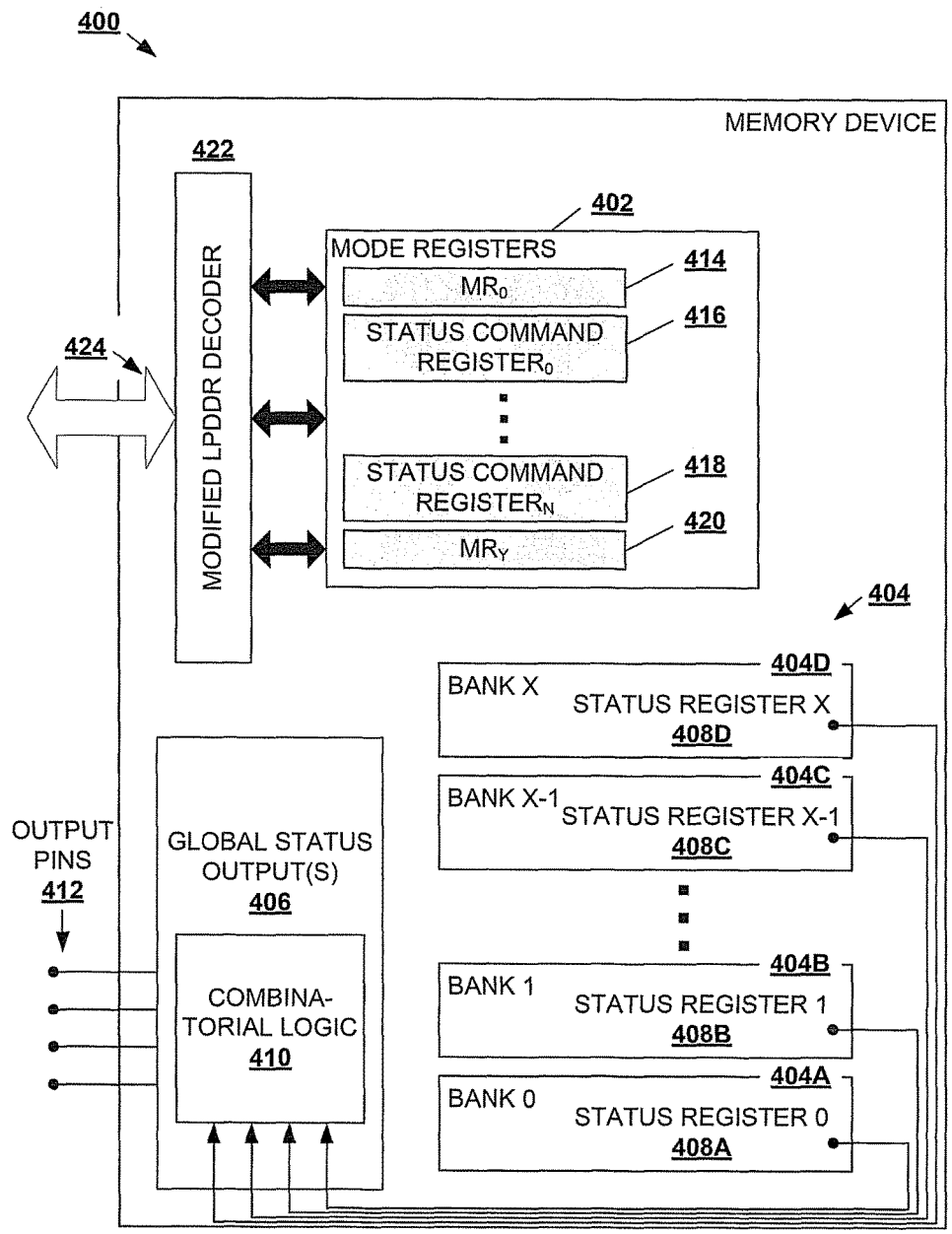
FIG. 4 depicts a block diagram of a sample memory with a modified LPDDR bus and combined bank-specific and global status data, in an embodiment.

FIG. 4 illustrates a block diagram of an example memory device 400 according to further embodiments of the present disclosure. Memory device 400 can comprise multiple banks of two-terminal memory 404, such as resistive-switching memory, phase-change memory, and so forth. Respective memory banks include memory bank$_0$ 404A, memory bank$_1$ 404B, . . . , memory bank$_{X-1}$ 404C, to memory bank$_X$ 404D (referred to collectively as memory banks 404A-404D), where X is a suitable integer greater than three. In some embodiments, memory banks 404A-404D can be individually addressable to facilitate operational control over respective memory banks (e.g., by an onboard controller or an external host—not depicted). In other embodiments, subsets of memory banks 404A-404D can be addressed separately from other subsets, so that respective groups of memory banks can be individually addressable separate from other groups. In the former embodiments, memory device 400 can bank-specific control over memory banks 404A-404D with an address of suitable size to individually address each of memory banks 404A-404D; in the latter embodiments, memory device 400 can reduce addressing overhead in combination with significant control over subsets of the memory banks 404A-404D.

As depicted, each of memory banks 404A-404D include a status register, including status registers 408A, 408B, . . . , 408C and 408D (referred to collectively as status registers 408A-408D). Status registers 408A-408D can be configured to maintain status information for associated memory banks 404A-404D. The status information can include array operation results for an associated memory bank(s) 404A-404D, such as read pass/fail status, write pass/fail status, or the like. Other status information can include busy/idle status for an associated memory bank(s) 404A-404D. Still other information can include error correction code (ECC) status for an associated memory bank(s) 404A-404D, or other suitable status information. Status information of status registers 408A-408D can be output to combinatorial logic 410 of a global status output(s) 406. Combinatorial logic 410 can be configured to provide a desired type of global status information, such as whether all of memory banks 404A-404D are busy (or, conversely, whether any memory banks are idle), whether all of memory banks 404A-404D are free from program errors (or, conversely, whether any memory banks have a program error), whether all of memory banks 404A-404D are free from write errors (or, conversely, whether any memory banks have a write error), whether all of memory banks 404A-404D are free from ECC errors (or, conversely, whether any memory banks have flagged an ECC error), and so on. In at least one embodiment, combinatorial logic 410 can be an OR circuit, that outputs a low signal in response to all memory banks 404A-404D being in a first status information state (e.g., busy, free of program errors, free of write errors, free of ECC errors, etc.), and outputs a high signal in response to any of memory banks 404A-404D being in a second status information state (e.g., idle, program error, write error, ECC error, etc.).

Global status output(s) 406 can additionally comprise a set of output pins 412 for outputting status information. Respective output pins 412 can provide a type or category of status information maintained by status registers 408A-408D and aggregated by combinatorial logic 410. In one embodiment, the set of output pins 412 can include 4 output pins, that respectively output a busy/idle state, a program pass/fail state, a write pass/fail state, and an ECC pass/fail state, where the respective states are a logically aggregated state (OR state, AND state, etc.) of memory banks 404A-404D. Output pins 412 can be employed as an interrupt output, in some embodiments, configured to interrupt a host device (not depicted) in response to a change in one of output pins 412. For instance, where one of output pins 412 transitions from a low signal to a high signal, the transition can interrupt processing of the host device, thereby notifying the host device of the changed state. The host device can then perform subsequent actions in response to the interrupt, such as request bank-specific status information, or status information pertinent to one or more subsets of memory banks 404A-404D. Subsequent actions can be programmed or configured to the host device by programming/configuration techniques known in the art or made known to one of skill in the art by way of the context provided herein.

In some embodiments, bank-specific status information can be obtained by writing directly to a status register 408A-408D of a target memory bank(s) 404A-404D. In these embodiments, a mode register write command can directly address a target status register utilizing an address space suitable to uniquely identify each of status registers 408A-408D. Status-related logic of memory device 400 can then cause the target status register to carry out the status command, which can include programming the target status register (e.g., to begin monitoring status information, or a particular type/category of status information, to stop monitoring status information, or stop monitoring a particular type/category of status information, etc.), or reading status information (or a subset of the type/category of status information maintained by the target status register) of an associated memory bank(s) 404A-404D, from the target status register. In at least one embodiment, each of status registers 408A-408D have an addressing mechanism that distinguishes them from associated memory banks 404A-404D. This allows command data to be read from or written to status registers 408A-408D directly, and independently of memory banks 404A-404D.

In other embodiments, bank-specific status information can be obtained by writing to one or more status command registers, included with a set of mode registers 402 of memory device 400. Mode registers 402 can include mode register$_0$ 414 through mode register$_Y$ 420, where Y is a suitable integer greater than 0. Additionally, mode registers 402 can include status command register$_0$ 416 through status command register$_N$ 418 (referred to collectively as status command registers 416-418), where N is a suitable integer greater than 0. A command written to one or more of status command registers 416-418 is interpreted as a status-related command by control logic of memory device 400, triggering status-related logic. The status-related logic can read the command written to status command register(s) 416-418 and identify an address of a target status register 408A-408D, as well as a status command to be carried out by the status register 408A-408D. In these embodiments, status commands are not written directly to status registers 408A-408D, but rather written to status command register(s) 416-418 and carried out by status-related logic of memory 400. These embodiments can be utilized, for instance, to simplify an address space provided for memory banks 404A-404D. For instance, a command that specifies an address of memory bank 404A, and is written to one or more of status command register(s) 416-418, can be determined by the control logic to be a status command targeting status register 408A, as opposed to, for instance, an array operation targeting memory bank 404A, or a configuration operation targeting memory bank 404A, or the like. Thus, in some embodiments, an addressing scheme to distinguish memory banks 404A-404D from status registers 408A-408D can be reduced by as much as half (e.g., in the case where memory device 400 comprises one status register per memory bank), as compared with an addressing scheme that allocates respective distinct addresses to each of memory banks 404A-404D and to each of status registers 408A-408D, for example.

Commands are received from a modified LPDDR interface 424 via a modified LPDDR decoder 422. In some embodiments, LPDDR interface 424 can be a modified LPDDR3 or LPDDR4 interface having greater than 10 command and address pins to convey command and address information. In at least one embodiment, LPDDR interface 424 can have 15 command and address pins, adding 10 bits to the LPDDR3 (or LPDDR4) command and address bus to uniquely address up to 1024 memory banks 404A-404D or 1024 groups of memory banks (e.g., where each group comprises 1 or more memory banks, and where a number of such memory banks can be separately configurable for different groups, e.g., see FIG. 5, infra). However, other sized command and address busses and additional command and address bits are envisioned by the inventor within the scope of the present disclosure.

In response to a command transmitted over modified LPDDR interface 424, modified LPDDR decoder 422 can be configured to decode the command. Control logic of memory device 400 can carry out the command, as decoded. Thus, status-related commands targeting a status register(s) 408A-408D of memory device 400 can be decoded by modified LPDDR decoder 422 and executed by the command logic (status-related command logic, in this case). Accordingly, memory device 400 can be configured to decode and respond to status commands for memory banks 404A-404D, acquiring status information for individual memory banks 404A-404D (or subsets of the memory banks 404A-404D, in some embodiments). Thus, in combination with global status output(s) 406, a host device can receive an interrupt in response to a change in global status information output at output pins 412, and utilize status commands over modified LPDDR decoder 422 to acquire bank-specific status information in response to the interrupt. Accordingly, a host device can implement real-time diagnostics utilizing bank-specific status commands to determine a memory bank(s) 404A-404D causing the change in global status information.

In alternative or additional embodiments of the present disclosure, one or more of status registers 408A-408D can be configured to write to status command register(s) 416-418 in response to determining a status event (e.g., idle event, program fail event, read fail event, ECC fail event, etc.). In particular, a status register 408A-408D identifying a status event can write an address of a memory bank(s) associated with the status event. In these embodiments, a host device can query status command register(s) 416-418 and read the address of the memory bank(s) associated with the status event. According to these embodiments, the host device can quickly and deterministively obtain an address of a memory bank(s) associated with a status event, in response to an interrupt associated with a change in global status output pins 412, for instance. In further embodiments, status registers 408A-408D can be configured to write an identifier associated with a subset of memory banks 404A-404D (e.g., 2 memory banks, 3 memory banks, 4 memory banks, etc.), when a memory bank of the subset of memory banks 404A-404D is associated with the status event. The host device can therefore exclude memory banks 404A-404D outside of the subset of memory banks 404A-404D as being a cause of the status event, improving efficiency of diagnostics with a smaller address space than would otherwise be required to deterministively identify individual memory banks 404A-404D. Upon reading the identifier associated with the subset of memory banks 404A-404D, the host device can individually query those memory banks 404A-404D within the subset of memory banks to identify the memory bank(s) causing the status event. Accordingly, various embodiments associated with memory device 400 can significantly improve diagnostic capabilities of a host device in relation to identify a source of a status event, and implementing suitable routines responsive to the status event.

Figure 5:
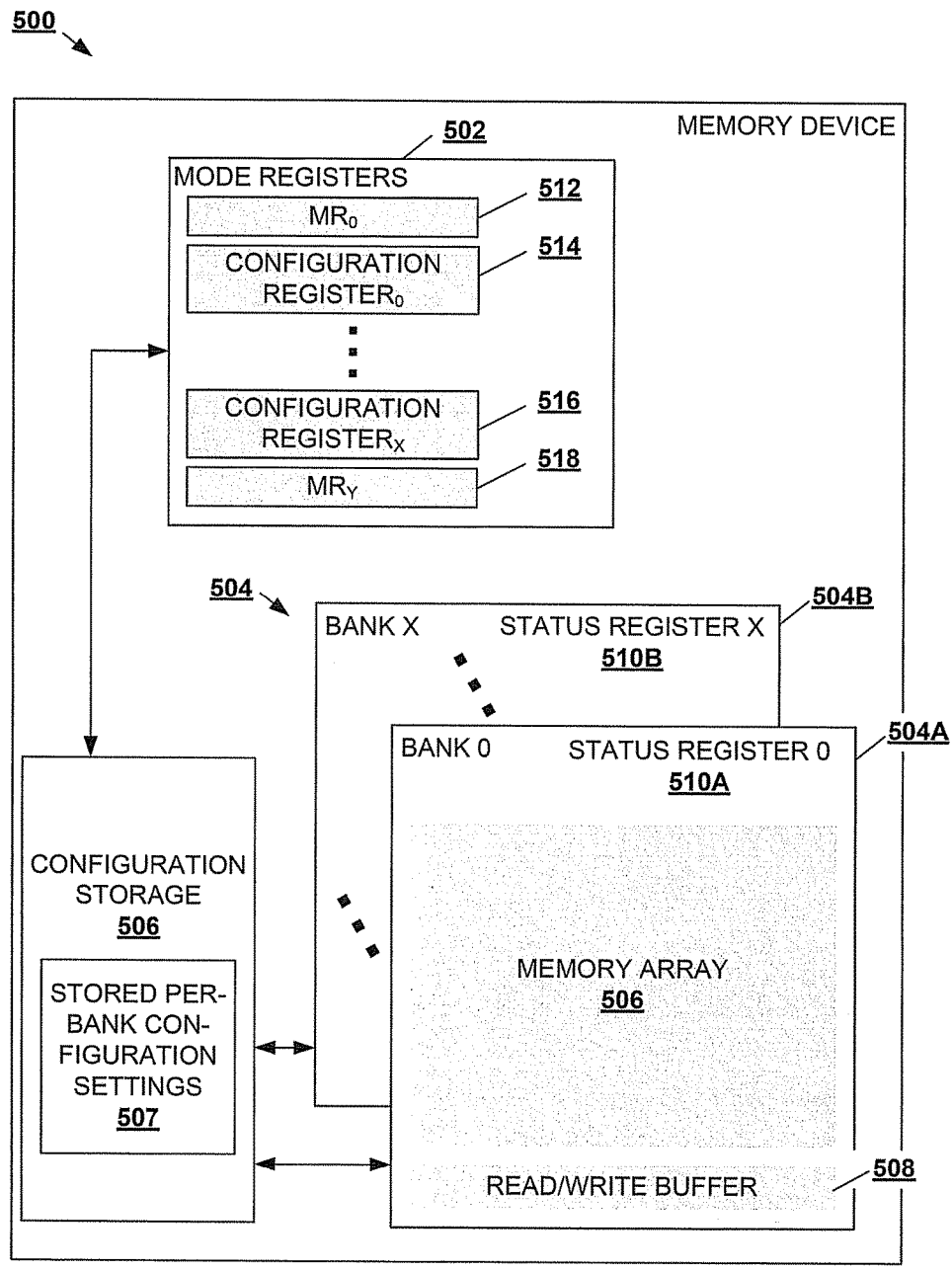
FIG. 5 illustrates a block diagram of an example multi-bank non-volatile memory device having bank-specific configuration capability, in further embodiments.

FIG. 5 depicts a block diagram of an example memory device 500 according to additional embodiments of the present disclosure. Memory device 500 can facilitate separate configurations for respective memory banks of memory device 500, or respective groups of memory banks. In some embodiments, memory device 500 can incorporate features of memory device 400, facilitating bank-specific configurations as well as bank-specific (and global) status information, though the subject disclosure is not limited to these embodiments.

Memory device 500 comprises a set of mode registers 502 and multiple memory banks, including memory bank$_0$ 504A through memory bank$_X$ 504B (referred to collectively as memory banks 504A-504B). Each of memory banks 504A-504B can comprise a memory array 506 of two-terminal memory (e.g., a resistive-switching memory array, etc.) and a read-write buffer 508. Additionally, memory banks 504A-504B can comprise respective status registers, including status register$_0$ 510A through status register$_X$ 510B (referred to collectively as status registers 510A-510B).

Mode registers 502 facilitate operational control over memory device 500. The mode registers 502 can comprise permanent and programmable settings for various memory banks 504A-504B, status registers 510A-510B, and other components of memory device 500. Some of the mode registers 502 can be read only devices programmed to an initial, fixed setting (e.g., post-fabrication, or post-shipment). Other mode registers can be configured to store programmable codes, values, etc., that can be read, erased and written in response to mode register commands received by memory device 500. As an example, mode registers 502 can comprise one or more configuration registers that facilitate programmable configurations for respective memory banks 504A-504B, or subsets of memory banks 504A-504B.

Mode registers 502 include a number, Y, of mode registers, from mode register$_0$ 512 through mode register$_Y$ 518, where Y is a suitable integer greater than 2. A subset of mode registers 502 include configuration registers, depicted as configuration register$_0$ 514 through configuration register$_X$ 516 (collectively referred to as configuration register(s) 514-516), where X is a suitable integer greater than zero.

Configuration register(s) 514-516 can be utilized to individually program different subsets of memory banks 504A-504B according to different configuration states. Configuration commands can be written to (or read from) configuration register(s) 514-516. The configuration commands can include an address or identifier for a target subset of memory banks 504A-504B, and a command value (e.g., a configuration code) identifying one or more configuration states for the target subset of memory banks 504A-504B. Further, different configuration commands can target different subsets of memory banks 504A-504B and program the different subsets to different configuration states. In various embodiments, suitable configuration states can include a single level cell state (SLC—storing a single bit of information) or multi-level cell state (MLC—storing multiple bits of information), enabling some memory banks to be configured as SLC memory banks and others to be configured as MLC memory banks. Other suitable configuration states can include selected hardware parameter values, such as clock speed(s), program voltage, read voltage, program latency, read latency, or the like, or suitable combinations of the foregoing. Still other suitable configuration states can include a set of software states, a set of logic states, or the like, with which individual memory banks can be configured to operate according to one (or more) of the set of software states or the set of logic states, etc.

In various embodiments, memory device 500 can provide significant flexibility to serve a diverse set of needs in the electronic memory space. As mentioned above, memory device 500 can comprise some memory banks 504A-504B configured for MLC memory arrays 506, to serve a need for relatively high memory density, and other memory banks 504A-504B configured for SLC memory array 506, to serve a need for relatively high performance, reliability or longevity memory storage. Other examples can include a first set of memory banks 504A-504B configured with relatively high operation voltage to achieve low latency, and a second set of memory banks 504A-504B configured with relatively low operation voltage and higher latency to achieve lower power consumption. Applications configured for better performance and low latency can utilize the first set of memory banks 504A-504B, whereas applications configured for low power consumption can utilize the second set of memory banks 504A-504B.

In some embodiments, memory device 500 can comprise configuration storage 506 that maintains configuration settings of memory banks 504A-504B. The configuration storage 506 can be separate from memory banks 504A-504B, in some embodiments, or can be respectively stored in a subset of memory banks 504A-504B in other embodiments. Configuration storage 506 can include stored per-bank configuration settings 507 that govern hardware, firmware or software configurations for respective ones of memory banks 504. Stored per-bank configuration settings 507 can be read, written or overwritten, to acquire or change configuration settings for memory banks 504.

FIG. 6 illustrates a diagram of an example mode register communication protocol 600 for issuing mode register commands to a disclosed memory device, according to one or more additional embodiments. Mode register communication protocol 600 is configured to operate with a modified LPDDR bus, having 15 command and address pins. The 15 command and address pins facilitate 30 bits of command and address information between a rising and falling edge of a clock. Command and address pins are depicted by command addresses 608 along a top direction of the diagram, comprising 15 bits on a rising clock edge and 15 bits on a falling clock edge. A mode register write 604 operation and a mode register read 606 operation illustrate information conveyed for each of the 30 bits of the respective operations. Mode register write 604 and mode register read 606 will be described below with respect to memory device 400 of FIG. 4, supra. However, it should be appreciated that such operations are applicable to other disclosed embodiments.

Mode register write 604 operation can employ command and address bits 00-03 on a rising clock edge to identify the mode register write 604 operation for modified LPDDR decoder 422. Command and address bits 04-09 on the rising clock edge, and bits 00-01 on the falling clock edge are mode register identifier bits, which provide an identifier (e.g., an address) for a target mode register of mode registers 402. The target mode register can be any of mode registers 402, including status command registers 416, 418, or configuration registers 514, 516 of FIG. 5, supra. Bits 02-09 on the falling clock edge comprise data to be written to the target mode register, identified by the mode register identifier bits. The data can include command code values, or the like, representing an operation associated with the target mode register. In addition, bits 10-14 on the rising clock edge and falling clock edge provide 10 bits to identify a target bank (or subset of banks) of memory banks 404A-404D to be affected by the operation. Accordingly, mode register write 604 can facilitate performing an operation on a target memory bank(s) of memory device 400, by identifying a target mode register associated with implementing or controlling the operation, a command value written to the target mode register that identifies the operation, and a target memory bank(s) on which the operation is to be performed. Bank-specific operations can include array operations, such as array read or write operations, status-related operations, such as acquiring status of one or more memory banks, or configuration operations, such as programming a memory bank according to a memory configuration or mode of operation.

Mode register read 606 operation can employ command and address bits 00-03 on the rising clock edge to identify the mode register read 606 operation to modified LPDDR decoder 422. Command and address bits 04-09 on the rising clock edge, and bits 00-01 on the falling clock edge identify a target mode register address for the mode register read 606 operation. Additionally, command and address bits 09-14 on the rising clock edge and falling clock edge can identify a target memory bank, where suitable, for the mode register read operation. In some embodiments, mode register read 606 can facilitate reading status information for the target memory bank, by identifying a status register(s) 416, 418 of mode registers 402, and a memory bank identifier of the target memory bank. Memory device 400 can acquire and reply with status information associated with the target memory bank in response to such a command. In other embodiments, mode register read 606 can facilitate reading configuration settings of the target memory bank, by identifying a configuration register(s) 514, 516 of mode registers 502, and the memory bank identifier of the target memory bank. The memory device then retrieves and replies with the configuration setting for the target memory bank. Note that bits 02-09 on the falling clock edge have no meaning in the depicted embodiment for mode register read 606. In at least one embodiment, these bits can be assigned to other suitable functions associated with reading mode register information.

Note that in some embodiments, mode register communication protocol may have fewer or more command and address pins 608. For instance, the number of command and address pins 608 can be related to a total number of individually addressable memory banks (or subsets of memory banks) included with an associated memory device. For larger than 1024 individually addressable memory banks (or subsets of memory banks), command and address pins 608 can comprise greater than 15 pins. For fewer than 1024 individually addressable memory banks (or subsets of memory banks), command and address pins 608 can comprise fewer than 15 pins. As an illustrative example, a memory device comprising 256 individually addressable memory banks can employ 8-bits of command and address pins 608 (e.g., pins CA 10-13 on the rising and falling clocks) to address a target memory bank(s). According to this example, mode register communication protocol 600 can employ 14 command and address pins 608 rather than the depicted 15, in one embodiment, or can employ the 15 command and address pins 608 leaving command and address pin 14 empty for mode register write 604 and mode register read 606, in an alternative embodiment.

FIG. 7 illustrates a block diagram of an example array access communication protocol 700 according to further embodiments of the present disclosure. Array access communication protocol 700 can be a modified LPDDR communication protocol, having additional bits for identifying one or more memory banks of a multi-bank memory device. Similar to mode register communication protocol 600, array access communication protocol 700 can comprise 15 command and address pins 708 in some embodiments. Although similar to FIG. 6, above, array access communication protocol 700 can employ a number of command and address pins 708 suitable to individually address respective ones of a total number of memory banks (or individually addressable subsets of memory banks) of a memory device. Thus, in alternative embodiments, command and address pins 708 can comprise more or fewer pins than depicted.

For instance, command addresses 708 can comprise command and address bits 10-14 on rising and falling clock edges, yielding 10 bits, for identifying a target memory bank(s) for memory array write 704, memory array read 706 and memory array activate 710 operations. Thus, array access communication protocol 700 can facilitate host control over array operations for a memory device having large numbers of memory banks; including bank-specific control for up to 1024 memory banks, or subset-specific control for even larger numbers of memory banks (e.g., a memory device having 1024 memory bank subsets, each subset comprising 2 memory banks, can facilitate control over respective pairs of 2048 memory bank with the 10-bits of memory bank identifier data). In combination with mode register communication protocol 600 of FIG. 6, supra, the host device can acquire bank-specific status information to inform bank-specific array operation strategies, facilitating significant improvement in memory bank utilization (e.g., duty cycle), yielding very high memory efficiencies over conventional memory devices.

Referring first to memory array write 704 and memory array read 706, command and address pins 00, 01, 02 on the rising clock edge distinguish memory array write 704 and memory array read 706 from other array commands and from each other. Command and address pins 05, 06 on the rising clock edge, and pins 01, 02, 03, 04, 05, 06 on the falling clock edge are column address bits, identifying a column of a target memory bank(s), and command and address bits 10, 11, 12, 13, 14 on the rising and falling clock edges identify the target memory bank(s), as discussed above. Command and address bit 00 on the falling clock edge provides AP information.

Likewise, command and address bits 00 and 01 on the rising clock edge distinguish memory array activate 710 from the memory array write 704 and memory array read 706 commands, as well as other LPDDR commands. Command and address bits 02 through 09 on the rising clock edge, and 00 through 09 on the falling clock edge are row address bits, identifying a row of the target memory bank(s) for the write (704) or read (706) operation. Similar to the foregoing commands, command and address bits 10-14 on the rising and falling clock edges identify the target memory bank(s).

The aforementioned diagrams have been described with respect to interaction between several components of an electronic device, a host, an interface, or memory architecture. It should be appreciated that in some suitable alternative aspects of the subject disclosure, such diagrams can include those components, devices, architectures, etc., specified therein, some of the specified components/devices/architectures, or additional components/devices/architectures. Sub-components can also be implemented as connected to other sub-components rather than included within a parent component. For example, multiple memory banks can be provided on separate memory chips, instead of on a single chip. Additionally, it is noted that one or more disclosed processes can be combined into a single process providing aggregate functionality. Components of the disclosed devices/architectures can also interact with one or more other components not specifically described herein but known by those of skill in the art.

Figure 8:
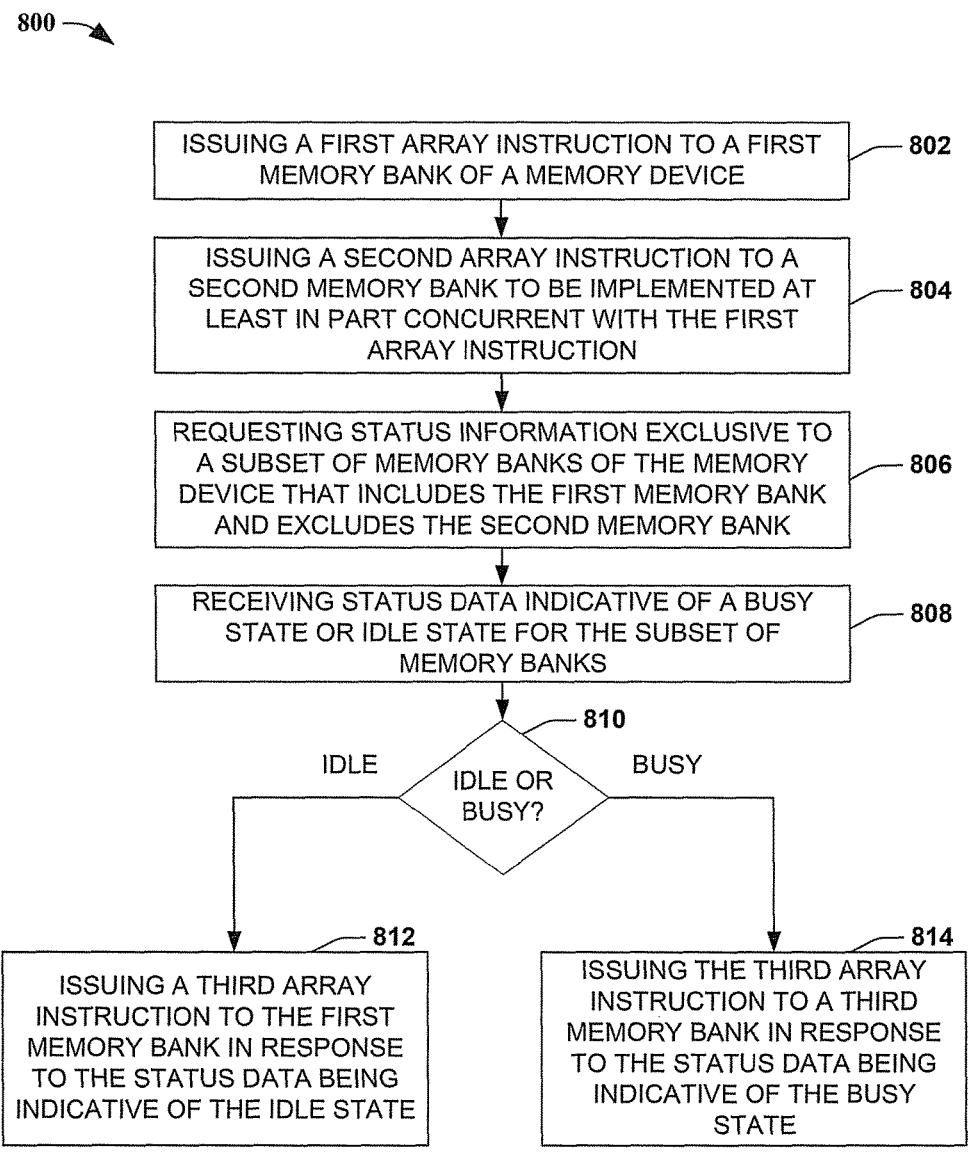
FIG. 8 illustrates a flowchart of a sample method for operating a multi-bank memory, in one or more additional embodiments.
Figure 9:
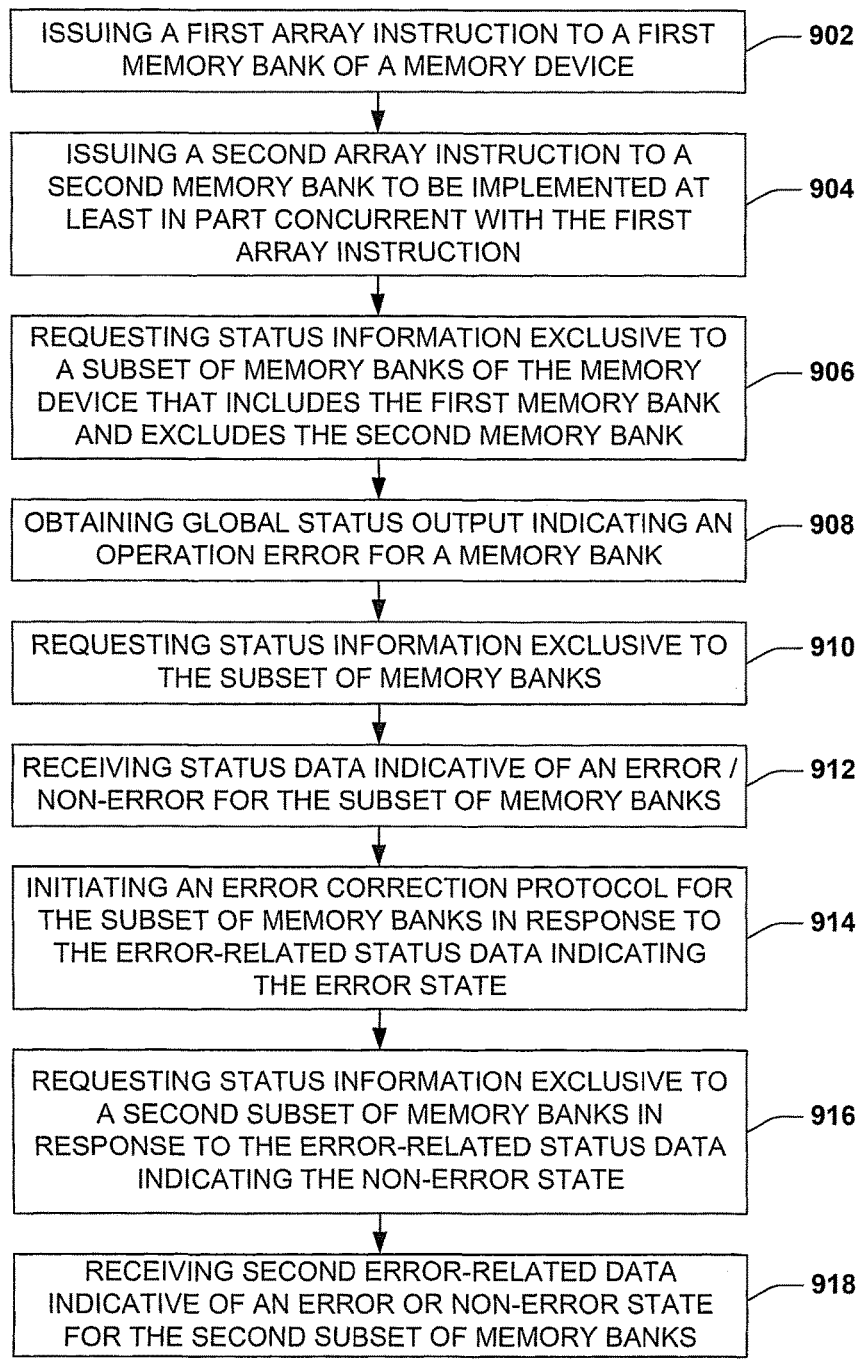
FIG. 9 depicts a flowchart of an example method for employing bank-specific status data for managing bank-specific memory operations, in an embodiment.
Figure 10:
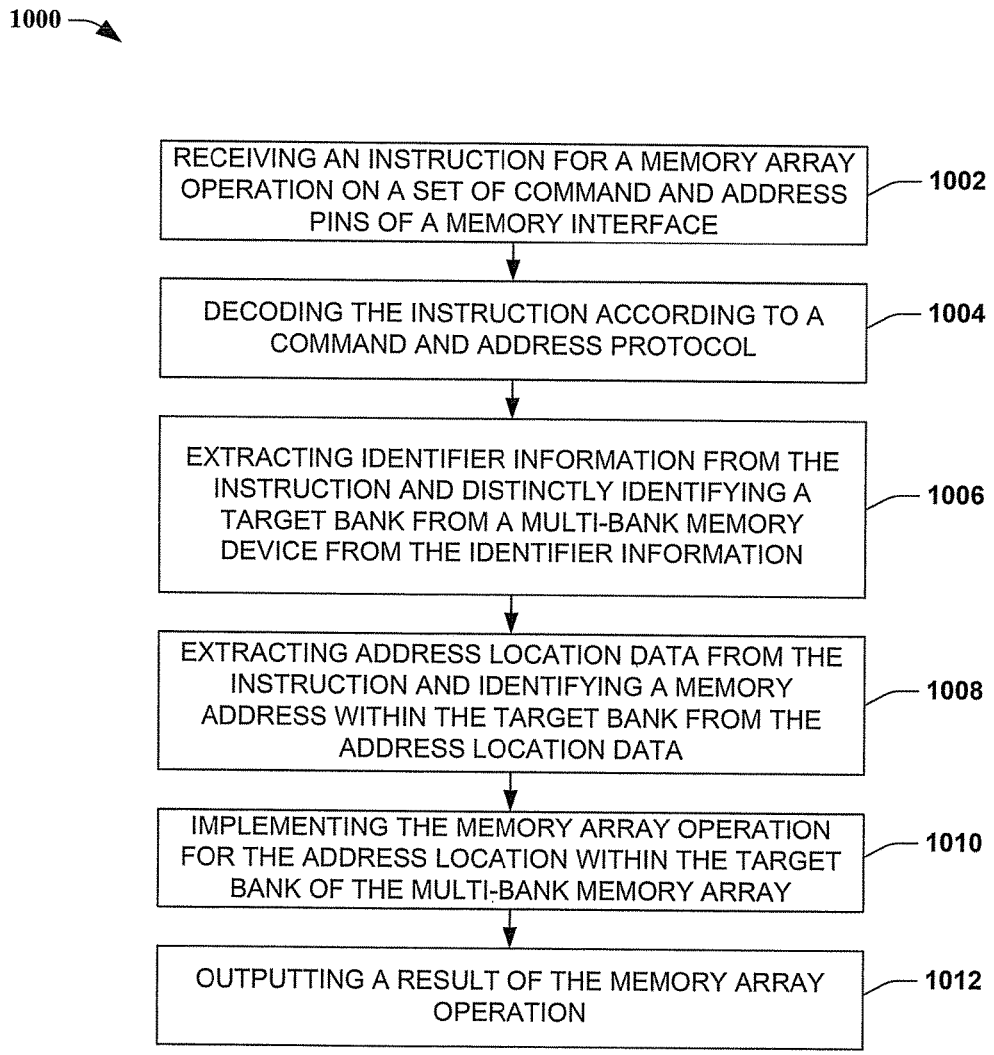
FIG. 10 depicts a flowchart of an example method of decoding and executing memory operations for a multi-bank memory device, in further embodiments.

In view of the exemplary diagrams described supra, process methods that can be implemented in accordance with the disclosed subject matter will be better appreciated with reference to the flow charts of FIGS. 8-10. While for purposes of simplicity of explanation, the methods of FIGS. 8-10 are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks are necessarily required to implement the methods described herein. Additionally, it should be further appreciated that some or all of the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

FIG. 8 illustrates a flowchart of an example method 800 according to still other embodiments of the present disclosure. At 802, method 800 can comprise issuing a first array instruction to a first memory bank of a memory device. At 804, method 800 can comprise issuing a second array instruction to a second memory bank of the memory device to be implemented at least in part concurrent with the first array instruction. Moreover, at 806, method 800 can comprise requesting status information exclusive to a subset of memory banks of the memory device, the subset including the first memory bank and excluding the second memory bank, and at 808, method 800 can comprise receiving status data in response to the requesting the status information, the status data is indicative of a busy state for the subset of memory banks or an idle state for the subset of memory banks. At 810, a determination can be made as to whether the status data is indicative of the busy state or the idle state. If the status information indicates the idle state, method 800 can proceed to 812, where method 800 can comprise issuing a third array instruction to the first memory bank in response to the status data being indicative of the idle state. If the status information indicates the busy state, method 800 can proceed to 814, where method 800 can comprise issuing the third array instruction to a third memory bank in response to the status data being indicative of the busy state. In a further embodiment, method 800 can additionally comprise obtaining global status output data from the memory device. Global status output data can comprise status information pertaining to the set of the memory banks of the memory device. Further, to this embodiment, issuing the second array instruction can be informed by, or in response to, the global status output indicating that at least one memory bank of the memory device is in the busy state.

FIG. 9 depicts a flowchart of an example method 900 for operating a multi-bank memory device according to further embodiments of the present disclosure. At 902, method 900 can comprise issuing a first array instruction to a first memory bank of a memory device. In one or more embodiments, the first array instruction can employ four or more bits of a command and address bus to identify the first memory bank of the memory device. At 904, method 900 can comprise issuing a second array instruction to a second memory bank to be implemented at least in part concurrent with the first array instruction. The second array instruction can identify the second memory bank utilizing the four or more bits of the command and address bus, in a further embodiment. At 906, method 900 can comprise requesting status information exclusive to a subset of memory banks of the memory device that includes the first memory bank and excludes the second memory bank. At 908, method 900 can comprise obtaining global status output indicating an operation error for at least one memory bank of the memory device. At 910, method 910 can comprise requesting status information exclusive to the subset of memory bank. At 912, method 900 can comprise receiving status data indicative of an error/non-error state for the subset of memory banks. At 914, method 900 can comprise initiating an error correction protocol for the subset of memory banks in response to the error-related status data indicating the error state. At 916, method 900 can additionally comprise requesting status information exclusive to a second subset of memory banks in response to the error-related status data indicating the non-error state. At 918, method 900 can comprise receiving second error-related data indicative of an error or non-error state for the second subset of memory banks.

FIG. 10 illustrates a flowchart of a sample method 1000 for operating a multi-bank memory device according to additional embodiments of the present disclosure. At 1002, method 1000 can comprise receiving an instruction for a memory array operation on a set of command and address pins of a memory interface. The instruction can be configured according to a command and address memory protocol and including identifier information that distinctly identifies a target bank of a plurality of memory banks of the multi-bank memory device, and an address location within the target bank. For instance, the plurality of memory bank s can comprise at least sixteen individually addressable memory banks, or sixteen individually addressable subsets of a larger number of memory banks (e.g., 32, 64, 128, 256, etc.). At 1004, method 1000 can comprise decoding the instruction according to the command and address memory protocol and identifying the target bank and the address location from the identifier information. At 1006, method 1000 can comprise implementing the memory array operation for the address location within the target bank of the multi-bank memory device. At 1008, method 1000 can comprise outputting a result of the memory array operation.

In an additional embodiment, decoding the instruction according to method 1000 can further comprise utilizing the command and address protocol to distinguish the target bank from a number of memory banks of the multi-bank array of memory, wherein the number of memory banks is selected from a group consisting of: 256 memory banks, 512 memory banks, or 1024 memory banks. In another embodiment, decoding the instruction according to the command and address protocol can additionally comprise decoding from eight bits to ten bits of bank identifier information as part of the command and address memory protocol to distinctly identify the target bank of the multi-bank memory.

According to one or more embodiments, method 1000 can further comprise receiving a status request on the set of command and address pins. Additionally, the method can comprise extracting second identifier information from the status request and identifying the target bank of the multi-bank memory from the second identifier information. Method 1000 can additionally comprise acquiring status information pertaining to the target bank of the multi-bank memory array, and outputting the status information in response to the status request. In some embodiments, status identifier information utilized to identify a target memory bank (or a target subset of the memory banks) can use an identical code as identifier information for array operations, whereas in other embodiments a different coding system can be employed for status identifier information versus identifier information for array operations. The different coding could be employed, for instance, where a different level of granularity is provided for status operations versus array operations. For instance, given 1024 memory banks, array operations may utilize a 10-bit code to distinctly identify each memory bank of the 1024 memory banks, whereas status information may utilize the 10-bit code for individual bank identification, or may utilize a smaller code to identify subsets of the 1024 memory banks (e.g., a 9-bit code to identify respective pairs of the 1024 memory banks, as one example). Thus, in some embodiments, the second identifier information can be identical to the identifier information included in the instruction, and in alternative embodiments the second identifier information can be different from the identifier information, yet still refer to the target bank, among other memory banks.

In additional embodiments, method 1000 can further comprise receiving an additional instruction for the target bank of the multi-bank memory array in response to the status information indicating the target bank is in an idle state, and implementing the additional instruction at the target bank. Further, method 1000 can comprise receiving a second instruction for a second target bank of the multi-bank memory array in response to the status information indicating the target bank is in the busy state and implementing the second instruction at the second target bank.

In yet another embodiment, method 1000 can additionally comprise outputting a global error status that indicates an error in response to one of the sixteen or more banks of memory having an error state. The global error status can be output in response to a request for the global error status (e.g., received over the command and address bus), in an embodiment. In an alternative or additional embodiment, the global error status can be a persistent output from the multi-bank memory device (e.g., an interrupt-driven output).

Figure 11:
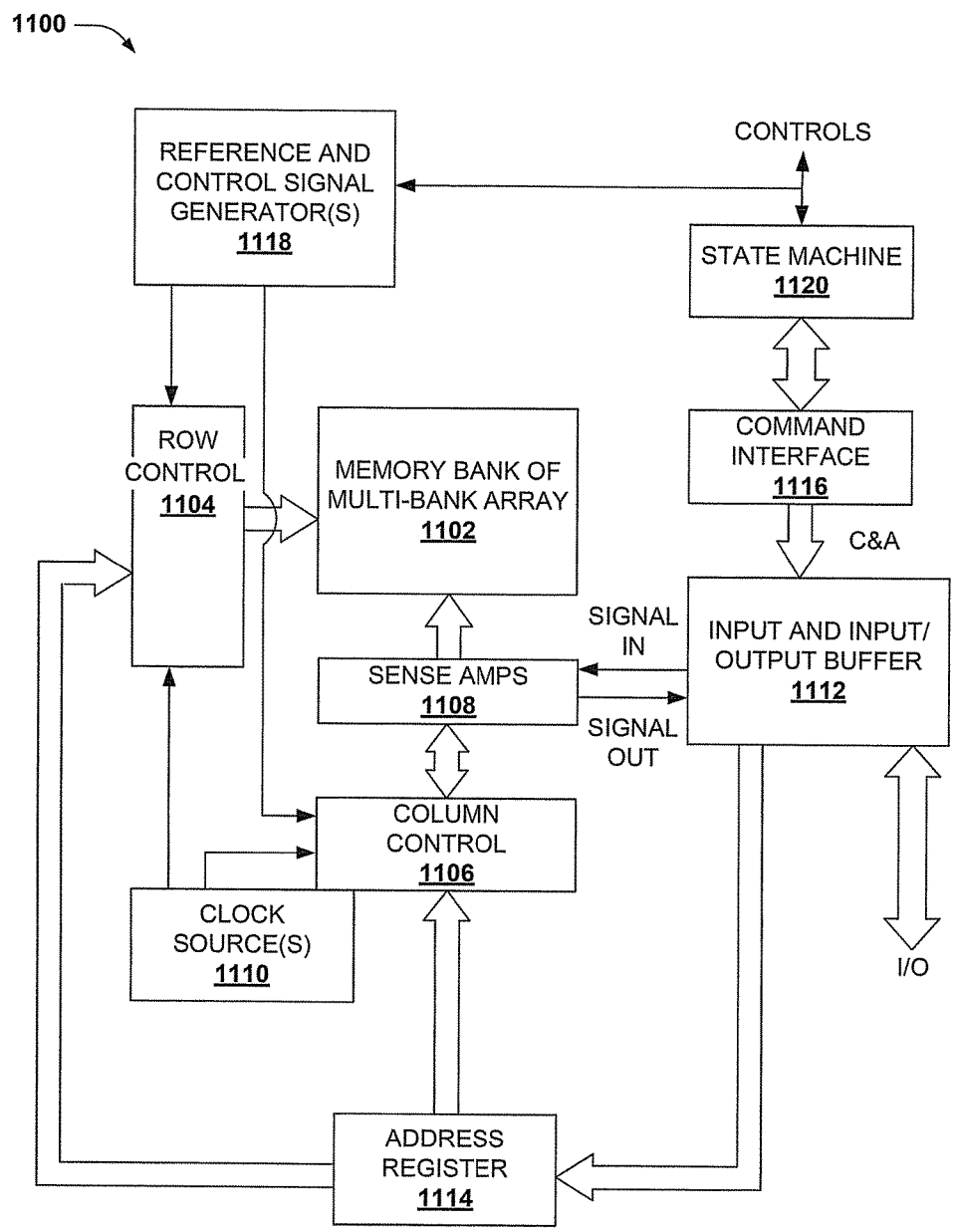
FIG. 11 depicts a block diagram of an example operating and control environment for a memory device according to disclosed embodiments.

In order to provide a context for the various aspects of the disclosed subject matter, FIG. 11, as well as the following discussion, is intended to provide a brief, general description of a suitable environment in which various aspects of the disclosed subject matter can be implemented or processed. While the subject matter has been described above in the general context of electronic memory or architectures and process methodologies for operating such memory or architectures, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer (e.g., computer 1302 of FIG. 13, infra), which can include single-processor or multiprocessor computer systems, mini-computing devices, mainframe computers, as well as personal computers, hand-held computing devices (e.g., PDA, smart phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the subject innovation can be practiced on stand-alone electronic devices, such as a memory card, Flash memory module, removable memory, or the like. In a distributed computing environment, program modules can be located in both local and remote memory storage modules or devices.

FIG. 11 illustrates a block diagram of an example operating and control environment 1100 for a memory bank 1102 of a multi-bank memory cell array according to aspects of the subject disclosure. In at least one aspect of the subject disclosure, memory bank 1102 can comprise memory selected from a variety of memory cell technologies. In at least one embodiment, memory bank 1102 can comprise a two-terminal memory technology, arranged in a compact two or three dimensional architecture. Suitable two-terminal memory technologies can include resistive-switching memory, conductive-bridging memory, phase-change memory, organic memory, magneto-resistive memory, or the like, or a suitable combination of the foregoing. In a further embodiment, memory bank 1102 can comprise a status register (not depicted—but see FIG. 4, infra) configured to generate and output status information pertinent to memory bank 1102. In yet another embodiment, memory bank 1102 can be configured to operate according to a first set of configurations (e.g., MLC, SLC, operation voltage, clock speed, latency, etc.) that is at least in part different from a second set of configurations of a second memory bank of the multi-bank array of memory.

A column controller 1106 and sense amps 1108 can be formed adjacent to memory bank 1102. Moreover, column controller 1106 can be configured to activate (or identify for activation) a subset of bitlines of memory bank 1102. Column controller 1106 can utilize a control signal provided by a reference and control signal generator(s) 1118 to activate, as well as operate upon, respective ones of the subset of bitlines, applying suitable program, erase or read voltages to those bitlines. Non-activated bitlines can be kept at an inhibit voltage (also applied by reference and control signal generator(s) 1118), to mitigate or avoid bit-disturb effects on these non-activated bitlines.

In addition, operating and control environment 1100 can comprise a row controller 1104. Row controller 1104 can be formed adjacent to and electrically connected with word lines of memory bank 1102. Further, utilizing control signals of reference and control signal generator(s) 1118, row controller 1104 can select particular rows of memory cells with a suitable selection voltage. Moreover, row controller 1104 can facilitate program, erase or read operations by applying suitable voltages at selected word lines.

Sense amps 1108 can read data from, or write data to the activated memory cells of memory bank 1102, which are selected by column control 1106 and row control 1104. Data read out from memory bank 1102 can be provided to an input and input/output buffer 1112 (e.g., an LPDDR buffer, in some embodiments). Likewise, data to be written to memory bank 1102 can be received from the input and input/output buffer 1112 and written to the activated memory cells of memory bank 1102.

A clock source(s) 1110 can provide respective clock pulses to facilitate timing for read, write, and program operations of row controller 1104 and column controller 1106. Clock source(s) 1110 can further facilitate selection of wordlines or bitlines in response to external or internal commands received by operating and control environment 1100. Input and input/output buffer 1112 can comprise a command and address input, as well as a bidirectional data input and output. Instructions are provided over the command and address input, and the data to be written to memory bank 1102 as well as data read from memory bank 1102 is conveyed on the bidirectional data input and output, facilitating connection to an external host apparatus, such as a computer or other processing device (not depicted, but see e.g., computer 1202 of FIG. 12, infra).

Input and input/output buffer 1112 can be configured to receive write data, receive an erase instruction, receive a status or maintenance instruction, output readout data, output status information, and receive address data and command data, as well as address data for respective instructions. Address data can be transferred to row controller 1104 and column controller 1106 by an address register 1110. In addition, input data is transmitted to memory bank 1102 via signal input lines between sense amps 1108 and input and input/output buffer 1112, and output data is received from memory bank 1102 via signal output lines from sense amps 1108 to input and input/output buffer 1112. Input data can be received from the host apparatus, and output data can be delivered to the host apparatus via the I/O bus.

Commands received from the host apparatus can be provided to a command interface 1116. Command interface 1116 can be configured to receive external control signals from the host apparatus, and determine whether data input to the input and input/output buffer 1112 is write data, a command, or an address. Input commands can be transferred to a state machine 1120.

State machine 1120 can be configured to manage programming and reprogramming of memory bank 1102 (as well as other memory banks of the multi-bank memory array). Instructions provided to state machine 1120 are implemented according to control logic configurations, enabling state machine 1120 to manage read, write, erase, data input, data output, and other functionality associated with memory bank 1102. In some aspects, state machine 1120 can send and receive acknowledgments and negative acknowledgments regarding successful receipt or execution of various commands. In further embodiments, state machine 1120 can decode and implement status-related commands, decode and implement configuration commands, and so on.

To implement read, write, erase, input, output, etc., functionality, state machine 1120 can control clock source(s) 1108 or reference and control signal generator(s) 1118. Control of clock source(s) 1108 can cause output pulses configured to facilitate row controller 1104 and column controller 1106 implementing the particular functionality. Output pulses can be transferred to selected bitlines by column controller 1106, for instance, or wordlines by row controller 1104, for instance.

In connection with FIG. 12, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 12:
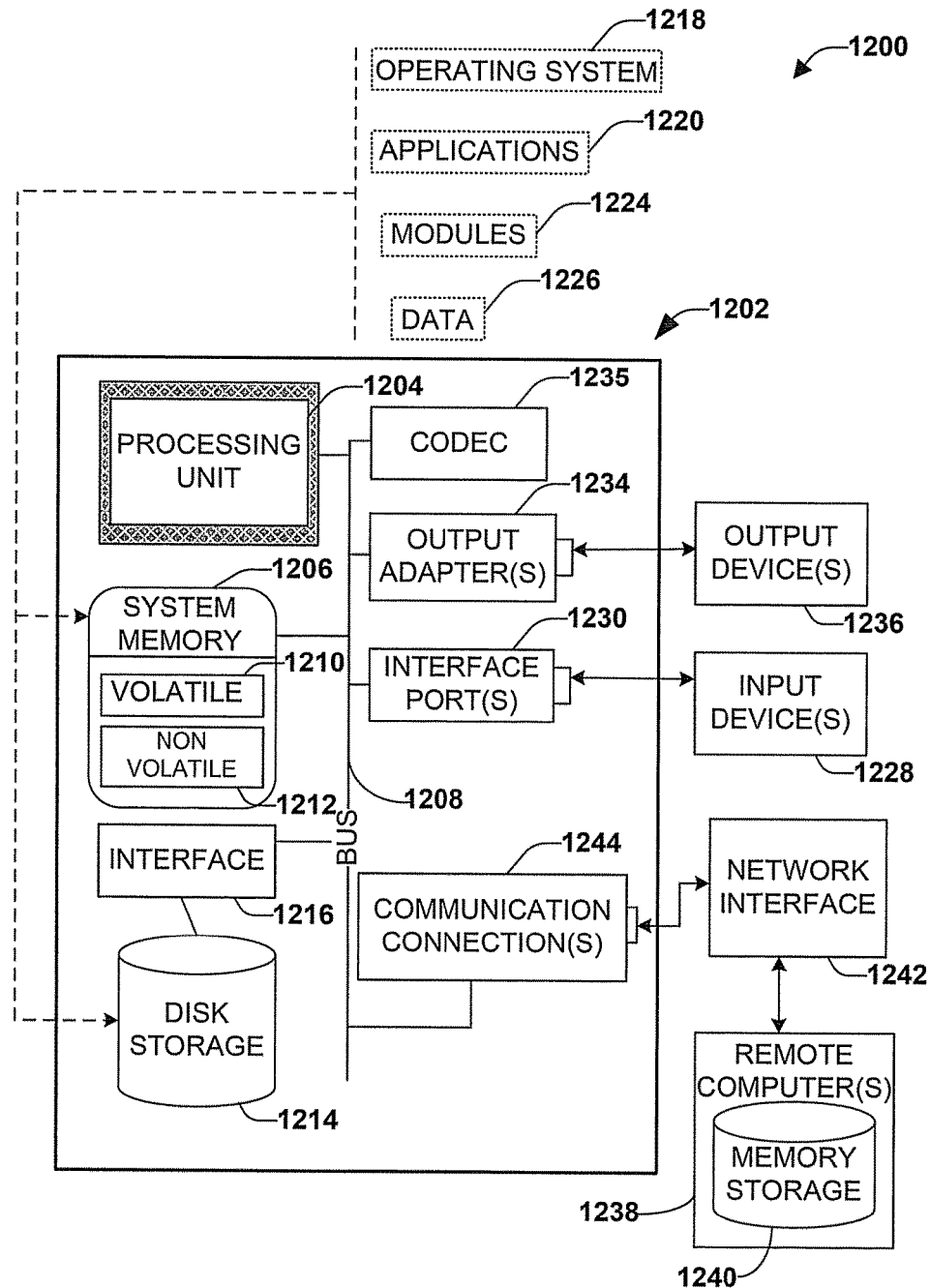
FIG. 12 illustrates a block diagram of an example computing environment that can be implemented in conjunction with various embodiments.

With reference to FIG. 12, a suitable operating environment 1200 for implementing various aspects of the claimed subject matter includes a computer 1202. The computer 1202 includes a processing unit 1204, a system memory 1206, a codec 1235, and a system bus 1208. The system bus 1208 couples system components including, but not limited to, the system memory 1206 to the processing unit 1204. The processing unit 1204 can be any of various available processors. Dual microprocessors and other multiprocessor architectures also can be employed as the processing unit 1204.

The system bus 1208 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1206 includes volatile memory 1210 and non-volatile memory 1214, which can employ one or more of the disclosed memory architectures, in various embodiments. The basic input/output system (BIOS), containing the basic routines to transfer information between elements within the computer 1202, such as during start-up, is stored in non-volatile memory 1212. In addition, according to present innovations, codec 1235 may include at least one of an encoder or decoder, wherein the at least one of an encoder or decoder may consist of hardware, software, or a combination of hardware and software. Although, codec 1235 is depicted as a separate component, codec 1235 may be contained within non-volatile memory 1212. By way of illustration, and not limitation, non-volatile memory 1212 can include read only memory (ROM), programmable ROM (PROM), electrically programmable ROM (EPROM), electrically erasable programmable ROM (EEPROM), or Flash memory. Non-volatile memory 1212 can employ one or more of the disclosed memory architectures, in at least some disclosed embodiments. Moreover, non-volatile memory 1212 can be computer memory (e.g., physically integrated with computer 1202 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 1210 includes random access memory (RAM), which acts as external cache memory, and can also employ one or more disclosed memory architectures in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM), and so forth.

Computer 1202 may also include removable/non-removable, volatile/non-volatile computer storage medium. FIG. 12 illustrates, for example, disk storage 1214. Disk storage 1214 includes, but is not limited to, devices such as a magnetic disk drive, solid state disk (SSD) floppy disk drive, tape drive, Jaz drive, Zip drive, LS-100 drive, flash memory card, or memory stick. In addition, disk storage 1214 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1214 to the system bus 1208, a removable or non-removable interface is typically used, such as interface 1216. It is appreciated that disk storage 1214 can store information related to a user. Such information might be stored at or provided to a server or to an application running on a user device. In one embodiment, the user can be notified (e.g., by way of output device(s) 1236) of the types of information that are stored to disk storage 1214 and/or transmitted to the server or application. The user can be provided the opportunity to opt-in or opt-out of having such information collected and/or shared with the server or application (e.g., by way of input from input device(s) 1228).

It is to be appreciated that FIG. 12 describes software that acts as an intermediary between users and the basic computer resources described in the suitable operating environment 1200. Such software includes an operating system 1218. Operating system 1218, which can be stored on disk storage 1214, acts to control and allocate resources of the computer 1202. Applications 1220 take advantage of the management of resources by operating system 1218 through program modules 1224, and program data 1226, such as the boot/shutdown transaction table and the like, stored either in system memory 1206 or on disk storage 1214. It is to be appreciated that the claimed subject matter can be implemented with various operating systems or combinations of operating systems.

A user enters commands or information into the computer 1202 through input device(s) 1228. Input devices 1228 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1204 through the system bus 1208 via interface port(s) 1230. Interface port(s) 1230 include, for example, a serial port, a parallel port, a game port, and a universal serial bus (USB). Output device(s) 1236 use some of the same type of ports as input device(s) 1228. Thus, for example, a USB port may be used to provide input to computer 1202 and to output information from computer 1202 to an output device 1236. Output adapter 1234 is provided to illustrate that there are some output devices, such as monitors, speakers, and printers, among other output devices, which require special adapters. The output adapter 1234 can include, by way of illustration and not limitation, video and sound cards that provide a means of connection between the output device 1236 and the system bus 1208. It should be noted that other devices and/or systems of devices provide both input and output capabilities such as remote computer(s) 1238.

Computer 1202 can operate in a networked environment using logical connections to one or more remote computers, such as remote computer(s) 1238. The remote computer(s) 1238 can be a personal computer, a server, a router, a network PC, a workstation, a microprocessor based appliance, a peer device, a smart phone, a tablet, or other network node, and typically includes many of the elements described relative to computer 1202. For purposes of brevity, only a memory storage device 1240 is illustrated with remote computer(s) 1238. Remote computer(s) 1238 is logically connected to computer 1202 through a network interface 1242 and then connected via communication connection(s) 1244. Network interface 1242 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks such as Integrated Services Digital Networks (ISDN) and variations thereon, packet switching networks, and Digital Subscriber Lines (DSL).

Communication connection(s) 1244 refers to the hardware/software employed to connect the network interface 1242 to the system bus 1208. While communication connection 1244 is shown for illustrative clarity inside computer 1202, it can also be external to computer 1202. The hardware/software necessary for connection to the network interface 1242 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. An electronic memory, comprising:
a memory cell array comprising multiple banks of non-volatile, two-terminal memory;
a set of mode registers to facilitate programming the electronic memory according to a programmed operation setting of a set of defined operation settings;
logic circuitry configured to implement operations on a subset of the multiple banks of the memory cell array according to the programmed operation setting and in response to a memory command received from a host device;
a bus interface facilitating communication with the host device, further comprising:
a command and address input comprising greater than ten signal pins for receipt of the memory command and of a physical memory address for the memory command, and
a bidirectional data bus for receiving new data to write to the physical memory address in response to the memory operation being a memory write, or for receiving stored data from the physical memory address and outputting the stored data in response to the memory operation being a memory read, the bidirectional data bus comprising greater than eight signal pins; and
a command and address decoder configured to receive greater than twenty bits of command and address information from the memory command, identify from the greater than twenty bits of command and address information a memory operation specified by the memory command, a target bank of the multiple banks of non-volatile, two-terminal memory and the physical memory address within the target bank.

2. The electronic memory of claim 1, wherein the command and address decoder and the logic circuitry are operable in combination with a modified dynamic random access memory protocol that defines memory operations and mode register operations utilizing greater than ten command and address signal pins and greater than twenty bits of command and address information.

3. The electronic memory of claim 2, wherein the modified dynamic random access memory protocol is one of:
a low power double data rate type 3 protocol modified to define and translate the greater than twenty bits of command and address information on the command and address input to address the multiple banks of the memory cell; or
a low power double data rate type 4 protocol modified to define and translate the greater than twenty bits of command and address information on the command and address input to address the multiple banks of the memory cell.

4. The electronic memory of claim 1, wherein the command and address input comprises fifteen signal pins and the command and address decoder is configured to receive and decode thirty bits of command and address information.

5. The electronic memory of claim 1, wherein the bidirectional data bus comprises at least sixteen signal pins.

6. The electronic memory of claim 1, wherein the logic circuitry is configured to implement a mode register command on a mode register of the set of mode registers in response to receipt of the mode register command on the command and address input.

7. The electronic memory of claim 1, wherein the logic circuitry is configured to implement the memory command at the target bank of the multiple banks of the memory cell array, at least in part concurrent with implementing a second memory command at a second memory bank of the multiple banks of the memory cell array.

8. The electronic memory of claim 1, further comprising a set of status registers that respectively track status information pertaining to respective subsets of the multiple banks of the memory cell array, wherein a status register of the set of status registers is configured to output status information for an associated subset of the multiple banks of the memory cell array in response to a status report command addressed to the status register, wherein the command and address input provides from two bits to 10 bits for status register address space for up to 1024 status registers.

9. The electronic memory of claim 8, wherein the logic circuitry is configured to obtain and output status information for the target bank from a status register of the set of status registers associated with the target bank, at least in part concurrent with implementing the memory command at the target bank.

10. The electronic memory of claim 8, wherein the status information tracked by a status register of the set of status registers includes a ready/busy state, a pass/fail state, or an error correction code (ECC) status, or a combination thereof, for one of the multiple banks of the memory cell array associated with the status register.

11. The electronic memory of claim 8, further comprising a global status output indicator configured to output global status information related to all of the multiple banks of the memory cell array.

12. The electronic memory of claim 11, wherein the global status output indicator is provided by one of:
one or more status-related mode registers of the set of mode registers configured to compile the global status information related to all of the multiple banks of the memory cell array from the set of status registers, and output the global status information in response to a global status report command; or
one or more global status signal pins that output a high signal in response to all of the set of status registers being in a first status state and output a low signal in response to one of the set of status registers being in a second status state.

13. The electronic memory of claim 1, wherein the non-volatile, two-terminal memory is a resistive-switching memory, a conductive-bridging memory, a phase-change memory, or a magneto-resistive memory.

14. The electronic memory of claim 1, wherein a memory cell of the non-volatile, two-terminal memory comprises:
a non-volatile resistive-switching device; and
a volatile resistive-switching selector device in electrical series with the non-volatile resistive-switching device.

15. The electronic memory of claim 14, wherein the memory cell comprising the non-volatile resistive-switching device in series with the volatile resistive-switching selector device is formed from a single discrete stack of layers formed between backend-of-line metal layers of an integrated circuit device.

16. A method of operating a memory device, comprising:
issuing a first array instruction to a first memory bank of the memory device over a bus structure comprising greater than ten command and address pins, the first array instruction incorporating greater than twenty bits of data;
issuing a second array instruction over the bus structure to a second memory bank of the memory device to be implemented at least in part concurrent with the first array instruction;
requesting status information over the bus structure exclusive to a subset of memory banks of the memory device, the subset including the first memory bank and excluding the second memory bank;
receiving status data over the bus structure in response to the requesting the status information, the status data is indicative of a busy state for the subset of memory banks or an idle state for the subset of memory banks; and one of:

issuing a third array instruction over the bus structure to the first memory bank in response to the status data being indicative of the idle state; or issuing the third array instruction over the bus structure to a third memory bank of the memory device, in response to the status data being indicative of the busy state.

17. The method of claim 16, further comprising obtaining global status output data from the memory device indicative of a status of the first memory bank, the second memory bank and the third memory bank of the memory device, wherein issuing the second array instruction is in response to the global status output indicating that at least one memory bank of the memory device is in the idle state.

18. The method of claim 16, further comprising:
obtaining a global status output from the memory device indicating at least one operation error for at least one memory bank of the memory device;
requesting status information exclusive to the subset of memory banks of the memory device;
receiving error-related status data indicative of an error state for the subset of memory banks or a non-error state for the subset of memory banks;
initiating an error correction protocol for the subset of memory banks in response to the error-related status data indicating the error state for the subset of memory banks;
requesting status information exclusive to a second subset of memory banks in response to the error-related status data indicating the non-error state for the subset of memory banks, the second subset of memory banks including the second memory bank and excluding the first memory bank; and
receiving second error-related status data indicative of an error state for the second subset of memory banks or a non-error state for the second subset of memory banks.

19. A method of implementing a memory operation received from a host device, comprising:
receiving an instruction for a memory array operation on a set of command and address pins of a memory interface;
decoding the instruction according to a command and address memory protocol;
extracting identifier information from the instruction and distinctly identifying a target bank from at least sixteen or more memory banks of a multi-bank non-volatile memory device from the identifier information, wherein the set of command and address pins comprises a number of pins suitable to individually address each of the at least sixteen or more memory banks;
extracting address location data from the instruction and identifying a memory address within the target bank from the address location data;
implementing the memory array operation for the address location within the target bank of the multi-bank memory array; and
outputting a result of the memory array operation.

20. The method of claim 19, further comprising distinctly identifying the target bank from a number of memory banks of the multi-bank memory selected from a group consisting of: 128 memory banks, 256 memory banks, 512 memory banks, and 1024 memory banks.

21. The method of claim 20, wherein the number of pins is suitable to individually address each of the number of memory banks utilizing a binary numbering system.

22. The method of claim 19, wherein the memory banks respectively store a total amount of data selected from a group consisting of: 0.5 gbit, 1 gbit, 2 gbit, and 4 gbit.

23. The method of claim 19, wherein decoding the instruction according to the command and address memory protocol further comprises decoding from eight bits to ten bits of bank identifier information as part of the command and address memory protocol to distinctly identify the target bank of the multi-bank memory.

24. The method of claim 19, further comprising:
receiving a status request on the set of command and address pins;
extracting second identifier information from the status request and identifying the target bank of the multi-bank memory from the second identifier information; and
acquiring status information pertaining to the target bank of the multi-bank memory array and outputting the status information in response to the status request.

25. The method of claim 24, wherein the second identifier information is one of:
identical to the identifier information included in the instruction; or
different from the identifier information included in the instruction.

26. The method of claim 24, further comprising at least one of:
receiving an additional instruction for the target bank of the multi-bank memory array in response to the status information indicating the target bank is in an idle state, and implementing the additional instruction at the target bank; or
receiving a second instruction for a second target bank of the multi-bank memory array in response to the status information indicating the target bank is in the busy state and implementing the second instruction at the second target bank.

27. The method of claim 19, further comprising outputting a global error status that indicates an error in response to one of the sixteen or more banks of memory having an error state, the global error status being output being one of:
output in response to a request for the global error status; or
a persistent output from the multi-bank memory array.

* * * * *